United States Patent
Shivaraman et al.

(10) Patent No.: US 11,417,775 B2
(45) Date of Patent: Aug. 16, 2022

(54) NANOWIRE THIN FILM TRANSISTORS WITH TEXTURED SEMICONDUCTORS

(71) Applicant: Intel Corporation, Santa Clara, CA (US)

(72) Inventors: Shriram Shivaraman, Hillsboro, OR (US); Van H. Le, Beaverton, OR (US); Abhishek A. Sharma, Hillsboro, OR (US); Gilbert W. Dewey, Beaverton, OR (US); Benjamin Chu-Kung, Portland, OR (US); Miriam R. Reshotko, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 876 days.

(21) Appl. No.: 16/043,593

(22) Filed: Jul. 24, 2018

(65) Prior Publication Data

US 2020/0035839 A1    Jan. 30, 2020

(51) Int. Cl.

| | |
|---|---|
| *H01L 29/786* | (2006.01) |
| *H01L 29/66* | (2006.01) |
| *H01L 29/06* | (2006.01) |
| *H01L 29/423* | (2006.01) |
| *H01L 21/02* | (2006.01) |
| *H01L 21/768* | (2006.01) |
| *H01L 23/00* | (2006.01) |

(52) U.S. Cl.
CPC .. *H01L 29/78696* (2013.01); *H01L 21/02645* (2013.01); *H01L 21/76876* (2013.01); *H01L 24/17* (2013.01); *H01L 29/0673* (2013.01); *H01L 29/42384* (2013.01); *H01L 29/66742* (2013.01); *H01L 29/7869* (2013.01)

(58) Field of Classification Search
CPC ........ H01L 21/02645; H01L 21/76876; H01L 24/17; H01L 29/78696; H01L 29/0673; H01L 29/42384; H01L 29/66742; H01L 29/7869
USPC ........................................................ 257/401
See application file for complete search history.

(56) References Cited

U.S. PATENT DOCUMENTS

2003/0215989 A1* 11/2003 Kim .................. H01L 29/78696
                                                          438/157
2006/0216897 A1*  9/2006 Lee ........................ B82Y 10/00
                                                          438/282

(Continued)

*Primary Examiner* — Tong-Ho Kim
(74) *Attorney, Agent, or Firm* — Akona IP

(57) ABSTRACT

Disclosed herein are transistor gate-channel arrangements that may be implemented in nanowire thin film transistors (TFTs) with textured semiconductors, and related methods and devices. An example transistor gate-channel arrangement may include a substrate, a channel material that includes a textured thin film semiconductor material shaped as a nanowire, a gate dielectric that at least partially wraps around the nanowire, and a gate electrode material that wraps around the gate dielectric. Implementing textured thin film semiconductor channel materials shaped as a nanowire and having a gate stack of a gate dielectric and a gate electrode material wrapping around the nanowire advantageously allows realizing gate all-around or bottom-gate transistor architectures for TFTs with textured semiconductor channel materials.

25 Claims, 21 Drawing Sheets

(56) References Cited

U.S. PATENT DOCUMENTS

2017/0062603 A1* 3/2017 Suzuki ............. H01L 29/42392
2018/0366587 A1* 12/2018 Le .................... H01L 21/02603

* cited by examiner

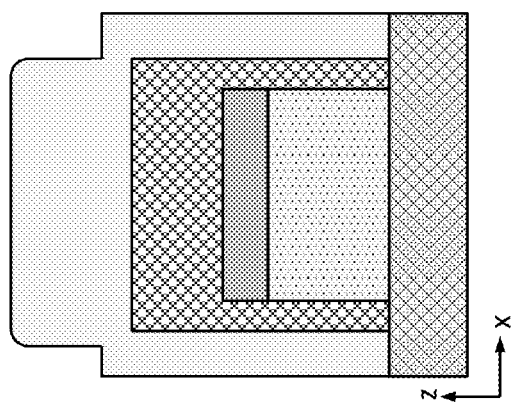
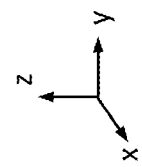
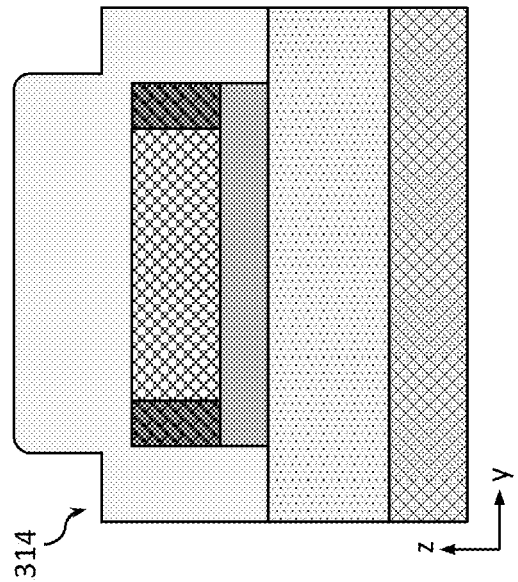
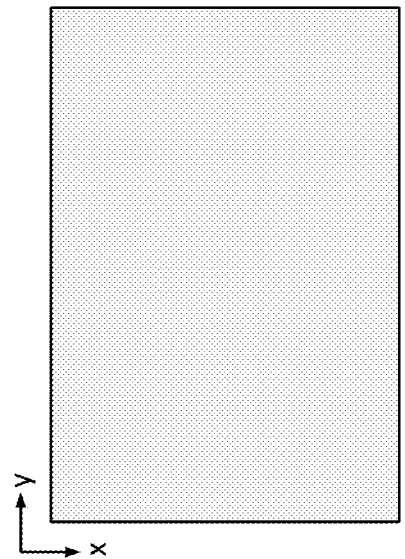
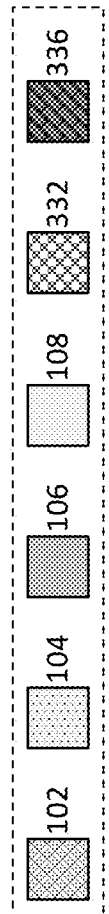
FIG. 3G

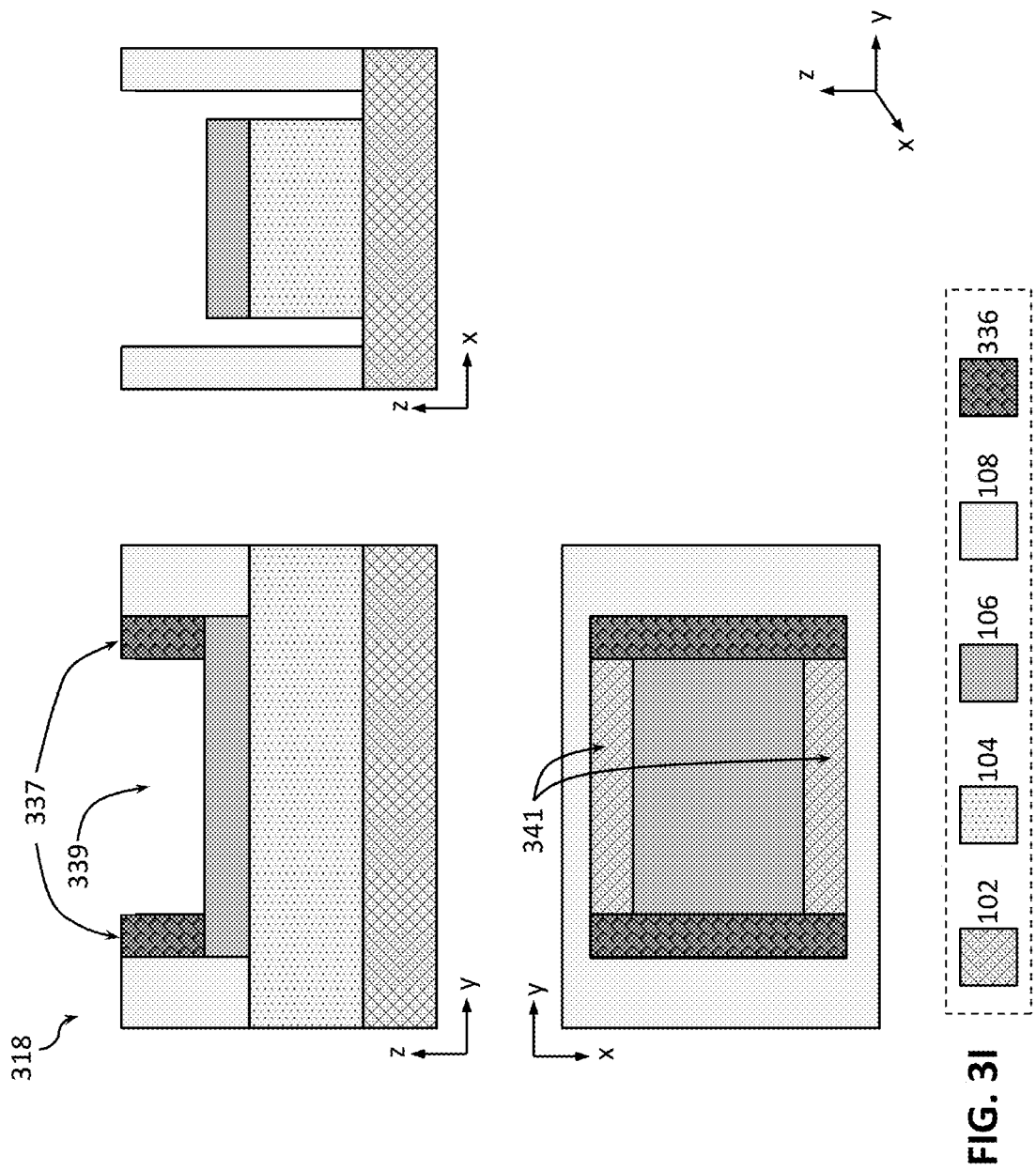

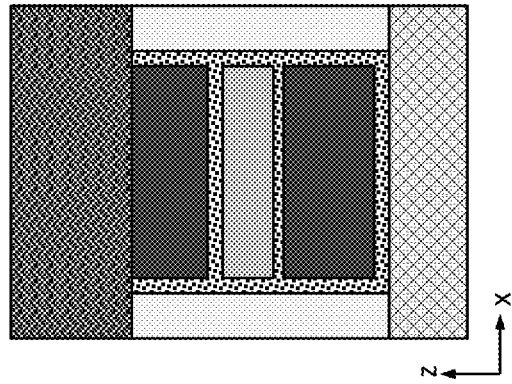
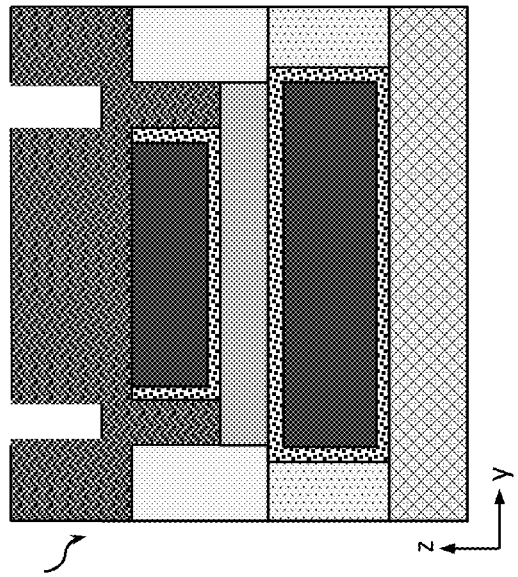
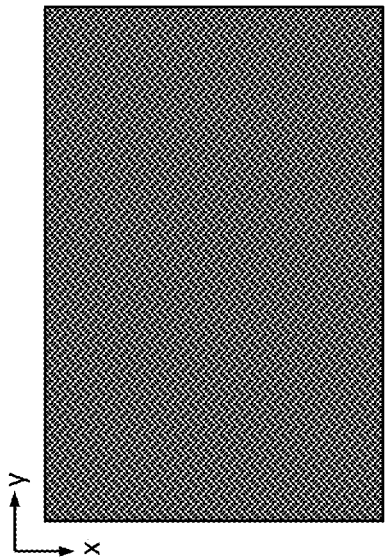
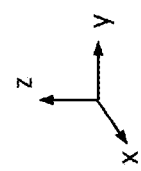
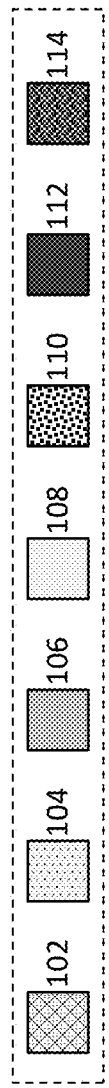
FIG. 3M

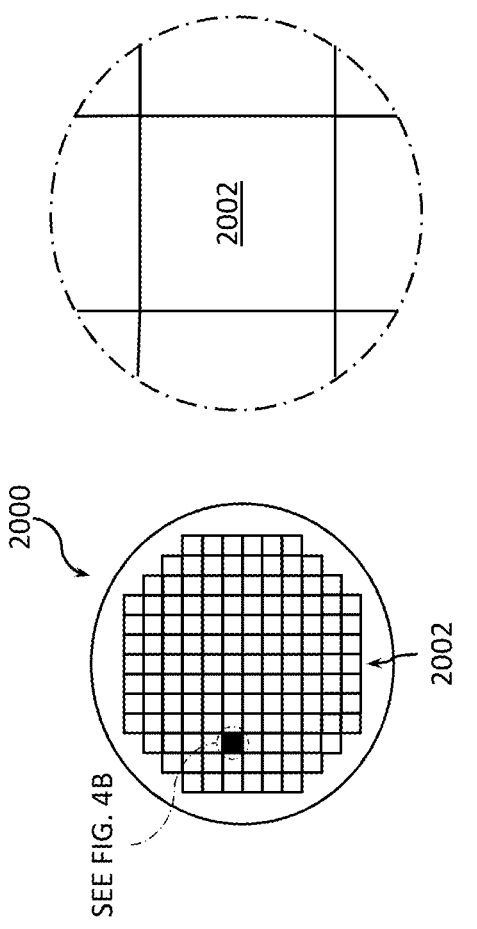

NANOWIRE THIN FILM TRANSISTORS WITH TEXTURED SEMICONDUCTORS

TECHNICAL FIELD

This disclosure relates generally to the field of semiconductor devices, and more specifically, to thin film transistors (TFTs).

BACKGROUND

TFT is a special kind of a field-effect transistor made by depositing a thin film of an active semiconductor material over a supporting, typically non-conductive, layer. At least a portion of the active semiconductor material forms a channel of the TFT. This is different from conventional, non-TFTs where the active semiconductor channel material is typically a part of a substrate, e.g. a part of a silicon wafer.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4B are top views of a wafer and dies that may include one or more nanowire TFTs with textured thin film semiconductors in accordance with any of the embodiments disclosed herein.

DETAILED DESCRIPTION

Overview

Figure 1:
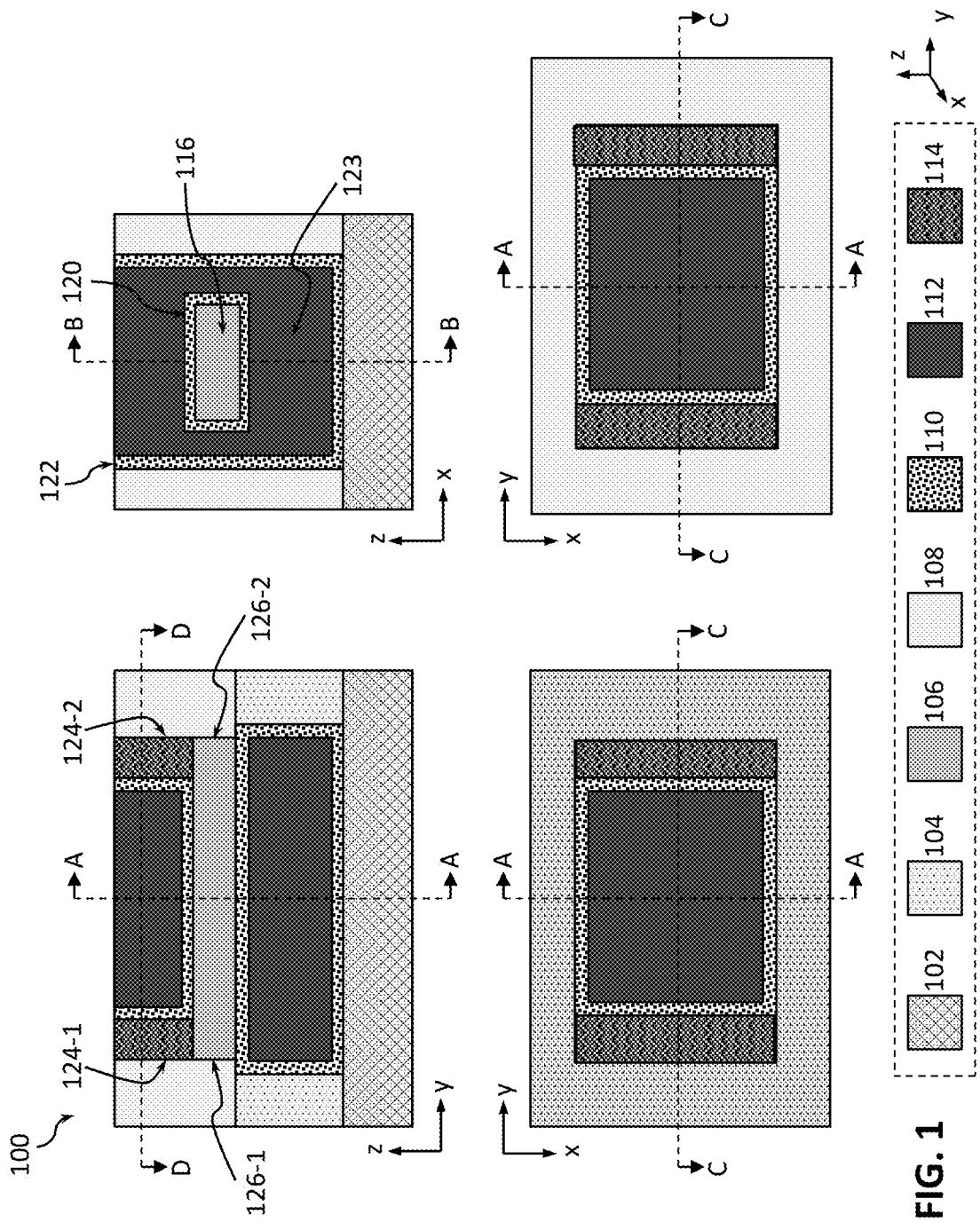
FIG. 1 illustrates different views of an example nanowire TFT with a textured thin film semiconductor, in accordance with some embodiments of the present disclosure.

Embodiments of the present disclosure relate to TFTs that use textured semiconductors as active materials ("active materials" may also be referred to as "channel materials").

In context of materials science, the term "texture" describes the statistical distribution of grain orientations, i.e., of crystallographic orientations of a polycrystalline material, which grain orientations may be observed and characterized using various atomic-level diffraction techniques, e.g., an x-ray diffraction or an electron-beam diffraction. A material in which these orientations are fully random is said to have no distinct texture. If the crystallographic orientations are not random, but have some preferred orientation, then the sample is said to have a weak, moderate, or strong texture, where the degree depends on the percentage of crystals having the preferred orientation. In context of the present disclosure, the term "textured semiconductor" refers to a thin film semiconductor material in which at least about 50% of the grains (e.g., at least about 75% or at least about 90% of the grains), have a certain preferred crystallographic orientation to the thin film material, where the exact type of "preferred crystallographic orientation" depends on the type of texture component desired for a given thin film semiconductor.

Texture can have a great influence on materials properties. In particular, using textured thin film semiconductors as channel materials are thought to improve reliability and performance of TFTs.

Usually, a textured semiconductor material for a TFT is grown on a seed layer which provides suitable nucleation conditions for development of a texture in the semiconductor. While such a seed layer may be made of a dielectric material, typically materials used in the seed layer are different from the preferred high-k dielectric materials used as gate dielectrics in transistors. Therefore, typical transistor architecture for TFTs employing textured semiconductor materials is a top-gate architecture (i.e. a transistor architecture where a gate stack is provided on top of a channel material).

Top-gate architecture may have drawbacks, e.g., in terms of adequate channel control at small dimensions or in terms of contact resistance. Therefore, exploring other transistor architectures, e.g., gate all-around (GAA) or bottom-gate architectures, for TFTs employing textures semiconductor materials would be desirable.

Disclosed herein are transistor gate-channel arrangements that may be implemented in, e.g., nanowire TFTs with textured semiconductors, and related methods and devices. For example, in some embodiments, a transistor gate-channel arrangement may include a substrate, a channel material that includes a textured thin film semiconductor material shaped as a wire, e.g., shaped as a nanowire (where the term "nanowire" refers to an elongated structure at least some dimensions of which are on a nanometer scale, e.g. between 1 and 1000 nanometers), a gate dielectric that at least partially wraps around the wire, and a gate electrode material that wraps around the gate dielectric. Implementing textured semiconductor channel materials shaped as a nanowire and having a gate stack of a gate dielectric and a gate electrode material wrapping around the nanowire advantageously allows realizing GAA or bottom-gate transistor architectures for TFTs with textured semiconductor channel materials, which may enable channel scaling to very small dimensions and may also provide benefits with respect to contact resistance reduction due to gate control of the channel region under the source/drain (S/D) contacts.

Nanowire TFTs with textured thin film semiconductors as described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 3A-3N, such a collection may be referred to herein without the letters, e.g., as "FIG. 3."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations may be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. Example nanowire TFT with a textured semiconductor FIG. 1 illustrates different views of an example nanowire TFT 100 with a textured thin film semiconductor, in accordance with some embodiments of the present disclosure. In particular, FIG. 1 illustrates two cross-sectional views (the two views in the upper portion of FIG. 1) and two top-down views (the two views in the lower portion of FIG. 1). Dashed lines AA, BB, CC, and DD shown in FIG. 1 are intended to illustrate planes which include those lines and are perpendicular to the plane of the drawing. The top left view of FIG. 1 is a cross-sectional view of the TFT 100 with the cross-section taken along the length of the channel of the TFT 100, namely a view of the y-z plane of the example coordinate system illustrated in FIG. 1, with a cross-section taken along a plane BB or along a plane CC illustrated in FIG. 1. The top right view of FIG. 1 is a cross-sectional view of the TFT 100 with the cross-section taken perpendicular to the length of the channel of the TFT 100, namely a view of the x-z plane of the example coordinate system illustrated in FIG. 1, with a cross-section taken along a plane AA illustrated in FIG. 1. The bottom left view of FIG. 1 is a top-down view of the TFT 100, namely a view of the y-x plane of the example coordinate system illustrated in FIG. 1, as seen from a plane DD illustrated in FIG. 1 if the insulating material 108 was not present (such a view shows more clearly some details of the inner structure of the TFT 100). The bottom right view of FIG. 1 is another top-down view of the TFT 100, which is still a view of the y-x plane of the example coordinate system illustrated in FIG. 1, as seen from a plane DD illustrated in FIG. 1 (i.e., with the insulating material 108 present). A number of elements referred to in the description of FIG. 1 and some of the subsequent figures with reference numerals are indicated in these figures with different patterns in order to not clutter the drawings, with a legend at the bottom of such figures (enclosed in a dashed rectangle) showing the correspondence between the reference numerals and the patterns.

Turning to the details of the TFT 100, as shown in FIG. 1, the TFT 100 includes a substrate 102, a seed layer 104 provided over the substrate 102, a channel material 106 shaped as a nanowire 116, an interlayer dielectric (ILD) 108 provided around the channel material 106, a gate stack wrapping around a portion of the nanowire 116, the gate stack including a gate dielectric 110 and a gate electrode material 112. As also shown in FIG. 1, the TFT 100 further includes first and second S/D contacts 114 provided at different respective ends of the nanowire 116.

The TFT 100 may be formed on the substrate 102 (e.g., the wafer 2000 of FIG. 4A, discussed below) and may be included in a die (e.g., the singulated die 2002 of FIG. 4B, discussed below). The substrate 102 may be a semiconductor substrate composed of semiconductor material systems including, for example, N-type or P-type material systems. The substrate 102 may include, for example, a crystalline substrate formed using a bulk silicon or a silicon-on-insulator (SOI) structure. In some embodiments, the substrate 102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Further materials classified as group II-VI or group III-V may also be used to form the substrate 102. In some embodiments, the substrate 2102 may be non-crystalline. In some embodiments, the substrate 2102 may be a printed circuit board (PCB) substrate. Although a few examples of materials from which the substrate 102 may be formed are described here, any material that may serve as a foundation for the TFT 100 as described herein may be used. While FIG. 1 illustrates that the TFT 100 is provided relatively close to the substrate 102, in what may be seen as a device layer, also sometimes referred to as a front-end of line (FEOL) layer, in other embodiments, the TFT 100 may be provided in one or more of back-end of line (BEOL) layers, e.g., in any of the BEOL layers 2106-2110 described with reference to FIG. 5. Thus, it is to be understood that further layers not specifically shown in FIG. 1 may be present between the substrate 102 and the seed layer 104 with the gate stack of the TFT 100.

The seed layer 104 may include any material suitable for ensuring that, when the channel material 106 is deposited on the seed layer 104, e.g. when the channel material 106 is deposited on the seed layer 104, the channel material 106 becomes textured. In various embodiments, the seed layer 104 may include one or more of dielectric or conductive materials such as oxides or nitrides of hafnium, aluminum, zirconium, indium, gallium, zinc, silicon.

The channel material 106 may be composed of semiconductor material systems including, for example, N-type or P-type materials systems. In some embodiments, the channel material 106 may include a high mobility oxide semiconductor material, such as tin oxide, antimony oxide, indium oxide, indium tin oxide, titanium oxide, zinc oxide, indium zinc oxide, indium gallium oxide, gallium oxide, titanium oxynitride, ruthenium oxide, or tungsten oxide. In general, the channel material 106 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, n- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel material 106 may be a thin film channel material. Some such materials may be deposited at relatively low temperatures, which makes them depositable within the thermal budgets imposed on back-end fabrication to avoid damaging the front-end components. In some embodiments, the channel material 106 may have a thickness (i.e. a dimension measured along the z-axis of the example coordinate system shown in FIG. 1) between about 5 and 30 nanometers, including all values and ranges therein.

As shown in FIG. 1, the channel material 106 may be shaped as the nanowire 116. In some embodiments, a length of the nanowire 116 (i.e. a dimension measured along the y-axis of the example coordinate system shown in FIG. 1), may be between about 10 and 3000 nanometers, including all values and ranges therein, e.g. between about 10 and 300 nanometers, or between about 50 and 200 nanometers. In some embodiments, a width of the nanowire 116 (i.e. a dimension measured along the x-axis of the example coordinate system shown in FIG. 1), may be between about 10 and 3000 nanometers, including all values and ranges therein, e.g. between about 10 and 300 nanometers, or between about 50 and 200 nanometers. A thickness of the nanowire 116 may be substantially equal to the thickness of the channel material 106, described above. In some embodiments, a cross-section of the nanowire 116 along a plane perpendicular to a long axis of the wire (i.e. a cross-section of the nanowire 116 taken along the x-z plane of the example coordinate system shown in FIG. 1) may be between about 1 and 500 square nanometers, including all values and ranges therein, e.g. between about 50 and 250 square nanometers, or between about 100 and 200 square nanometers. FIG. 1 illustrates cross-sections of the nanowire 116 being shaped as rectangles. However, in other embodiments, the nanowire 116 of the TFT 100 may adapt any other shapes, either intentionally or as an unintended result of fabrication processes used to form the nanowire 116 and surrounding elements of the TFT 100. For example, in various embodiments, the nanowire 116 may have a shape that is substantially a trapezoid, a square, any other polygon, an oval, or a circle.

The insulating material 108 may be disposed around the nanowire 116 and at least portions of the gate stack of the TFT 100, e.g., as shown in FIG. 1. The insulating material 108 may be a dielectric material, such as silicon dioxide. In some embodiments, the insulating material 108 may include any suitable ILD material such as silicon oxide, silicon nitride, aluminum oxide, and/or silicon oxynitride.

FIG. 1 illustrates that the gate dielectric 110 may include a first portion 120 that wraps around at least a portion of the nanowire 116 of the channel material 106. FIG. 1 illustrates an embodiment where the portion 120 of the gate dielectric 110 wraps entirely around the nanowire 116 (see e.g. the x-z view shown in FIG. 1), in which case the TFT 100 is a GAA transistor. In other embodiments of the TFT 100, the portion 120 of the gate dielectric 110 may wrap around only a portion of the nanowire 116. For example, in some such embodiments, the portion 120 may be provided only at the bottom of the nanowire 116 (the "bottom" of the nanowire 116 being the portion/face of the nanowire 116 closest to the substrate 102 and the "top" of the nanowire 116 being the portion/face of the nanowire 116 farthest away from the substrate 102, e.g., opposite the bottom face of the wire), in which case the TFT 100 would be a bottom-gate transistor. In another example, the portion 120 may be provided at the bottom of the nanowire 116 and one or more of the sides of the nanowire 116 (the "sides" of the nanowire 116 being the portions/faces, between the bottom and the top of the nanowire 116).

FIG. 1 also illustrates that, in some embodiments, the gate dielectric 110 may further be provided in some portions other than wrapping around the nanowire 116, shown in FIG. 1 as a portion 122, which may be indicative of one example fabrication method used to form the TFT 100, namely the method 200 of FIG. 2, described below. In such embodiments, if a portion of the gate electrode material 112 between the bottom of the nanowire 116 and the substrate 102 is referred to as a "bottom portion" 123, then some gate dielectric 110 may be provided between the bottom portion 123 of the gate electrode material 112 and the bottom of the nanowire 116 of the channel material 106 (namely, part of the gate dielectric 110 of the portion 120), while some gate dielectric 110 may be provided between the bottom portion 123 of the gate electrode material 112 and the substrate 102 (namely, part of the gate dielectric 110 of the portion 122). Thus, in such embodiments, not all of the gate dielectric 110 may be provided just between the channel material 106 and the gate electrode material 112—some gate dielectric 110 may also be present between the gate electrode material 112 and the substrate 102, i.e., below the bottom portion 123 of the gate electrode material 112. In other embodiments (not specifically shown in the FIGS.), the portion 122 of the gate dielectric 110 may be absent, e.g., when a method other than the method 200 is used to fabricate the TFT 100, or when the method 200 is used but the portion 122 is removed.

As can also be seen in FIG. 1, the bottom portion 123 of the gate electrode material 112 (as well as the adjacent gate dielectric 110) may be seen as provided within an opening in the seed layer 104, discussed in greater detail below with reference to FIG. 2. Thus, in some embodiments, at least a portion of the seed layer 104 underneath at least a portion of the channel material 106 of the nanowire 116 may be removed to form an opening for the bottom portion 123 of the gate electrode material 112.

The gate dielectric 110 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 110 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 110 during manufacture of the TFT 100 to improve the quality of the gate dielectric 110. In some embodiments, the gate dielectric 110 may be a multilayer gate dielectric, e.g., it may include any of the high-k dielectric materials in one layer and a layer of low-k dielectric. In some embodiments, the gate dielectric 110 may have a thickness between about 0.5 nanometers and 10 nanometers, including all values and ranges therein, e.g., between about 1 and 3 nanometers, or between about 1 and 2 nanometers.

As also shown in FIG. 1, the gate electrode material 112 may wrap around the nanowire 116 of the channel material 106 as well so that the gate dielectric 110 is disposed between the channel material 106 and the gate electrode material 112. In particular, the gate electrode material 112 may surround the portion 120 of the gate dielectric 110, as shown in FIG. 1.

The gate electrode material 112 may include at least one P-type work function metal or N-type work function metal, depending on whether the TFT 100 is a P-type metal oxide semiconductor (PMOS) transistor or an N-type metal oxide semiconductor (NMOS) transistor. For a PMOS transistor, metals that may be used for the gate electrode material 112 may include, but are not limited to, ruthenium, palladium, platinum, cobalt, nickel, and conductive metal oxides (e.g., ruthenium oxide). For an NMOS transistor, metals that may be used for the gate electrode material 112 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 112 may include a stack of two or more metal layers, where one or more metal layers are work function metal layers and at least one metal layer is a fill metal layer. Further metal layers may be included for other purposes, such as to act as a barrier layer.

As further shown in FIG. 1, the TFT 100 includes a pair of S/D contacts 114. As known in the art, S/D contacts are interchangeable, meaning that designation of which electrode of the pair of S/D contacts 114 is a "source" electrode and which electrode is a "drain" electrode may vary, i.e., in some embodiments the S/D contact 114 shown on the left side of the TFT 100 of FIG. 1 may be a source electrode and the S/D contact 114 shown on the right side may be a drain electrode, while in other embodiments the S/D contact 114 shown on the left side may be a drain electrode and the S/D contact 114 shown on the right side may be a source electrode. Each of the two S/D contacts 114 may include any suitable electrically conductive material, alloy, or a stack of multiple electrically conductive materials. In some embodiments, one or both of the S/D contacts 114 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, one or both of the S/D contacts 114 may include one or more electrically conductive alloys, oxides, or carbides of one or more metals. In some embodiments, one or both of the S/D contacts 114 may include a doped semiconductor, such as silicon or another semiconductor doped with an N-type dopant or a P-type dopant. When any of the S/D contacts 114 includes a doped material, the materials used for such S/D contacts 114 may take the form of any of the S/D regions 2120 discussed below with reference to FIG. 5. Metals may provide higher conductivity, while doped semiconductors may be easier to pattern during fabrication. In some embodiments, the S/D contacts 114 may have a thickness between about 2 nanometers and 1000 nanometers, preferably between about 2 nanometers and 100 nanometers. The S/D contacts 114 may, interchangeably, be referred to as "S/D terminals" or "S/D contacts."

FIG. 1 illustrates an embodiment of the TFT 100 where the S/D contacts 114 may be substantially aligned with the nanowire 116. In particular, a side 124-1 of the S/D contact 114 shown on the left side of the TFT 100 may be aligned with a first end 126-1 of the nanowire 116, while a side 124-2 of the S/D contact 114 shown on the right side of the TFT 100 may be aligned with a second end 126-2 of the nanowire 116. Such an alignment may be indicative of one example fabrication sequence used to form the TFT 100, namely the fabrication sequence as illustrated with FIGS. 3C-3J being performed as one embodiment of the process 206 of the method 200 of FIG. 2, described below. In other embodiments of the TFT 100, one or both of the S/D contacts 114 are not aligned in this manner.

Fabricating a Nanowire TFT with a Textured Semiconductor

The nanowire TFT 100 as described herein may be formed using any suitable techniques, e.g., subtractive, additive, damascene, dual-damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

Figure 2:
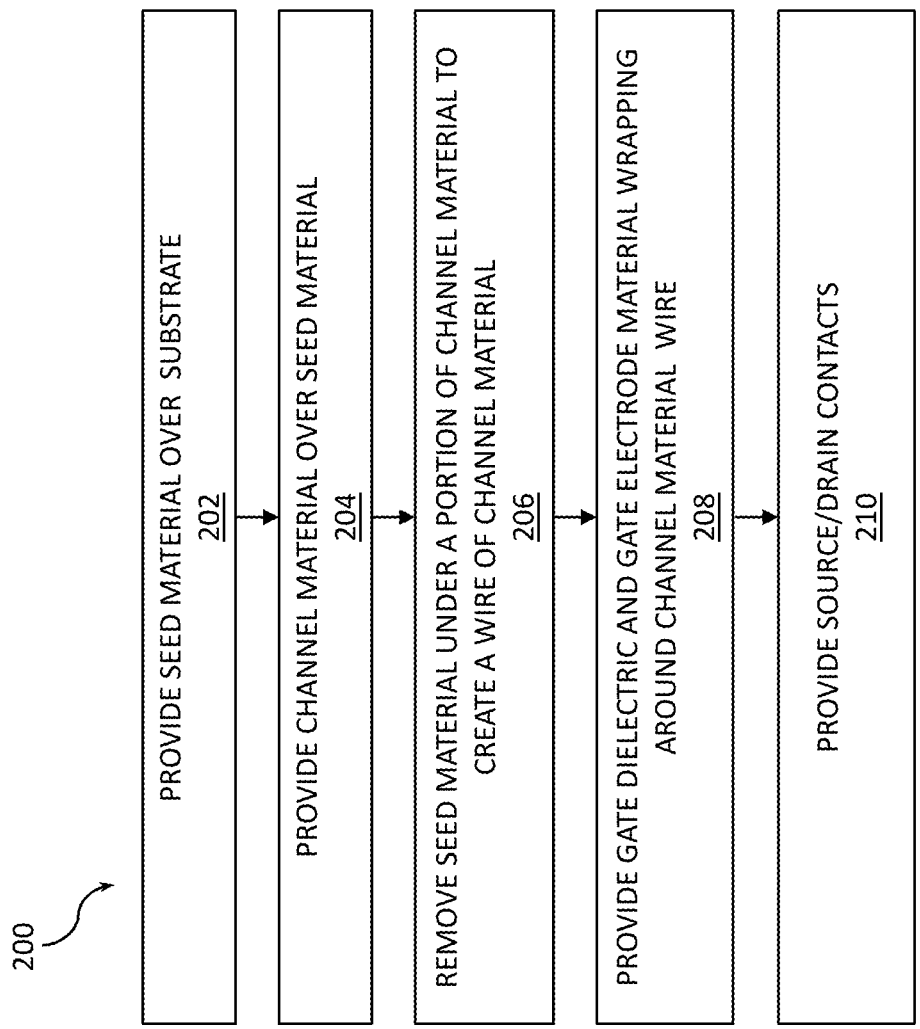
FIG. 2 is a flow diagram of an example method for fabricating a nanowire TFT with a textured thin film semiconductor, in accordance with some embodiments of the present disclosure.
Figure 3A:
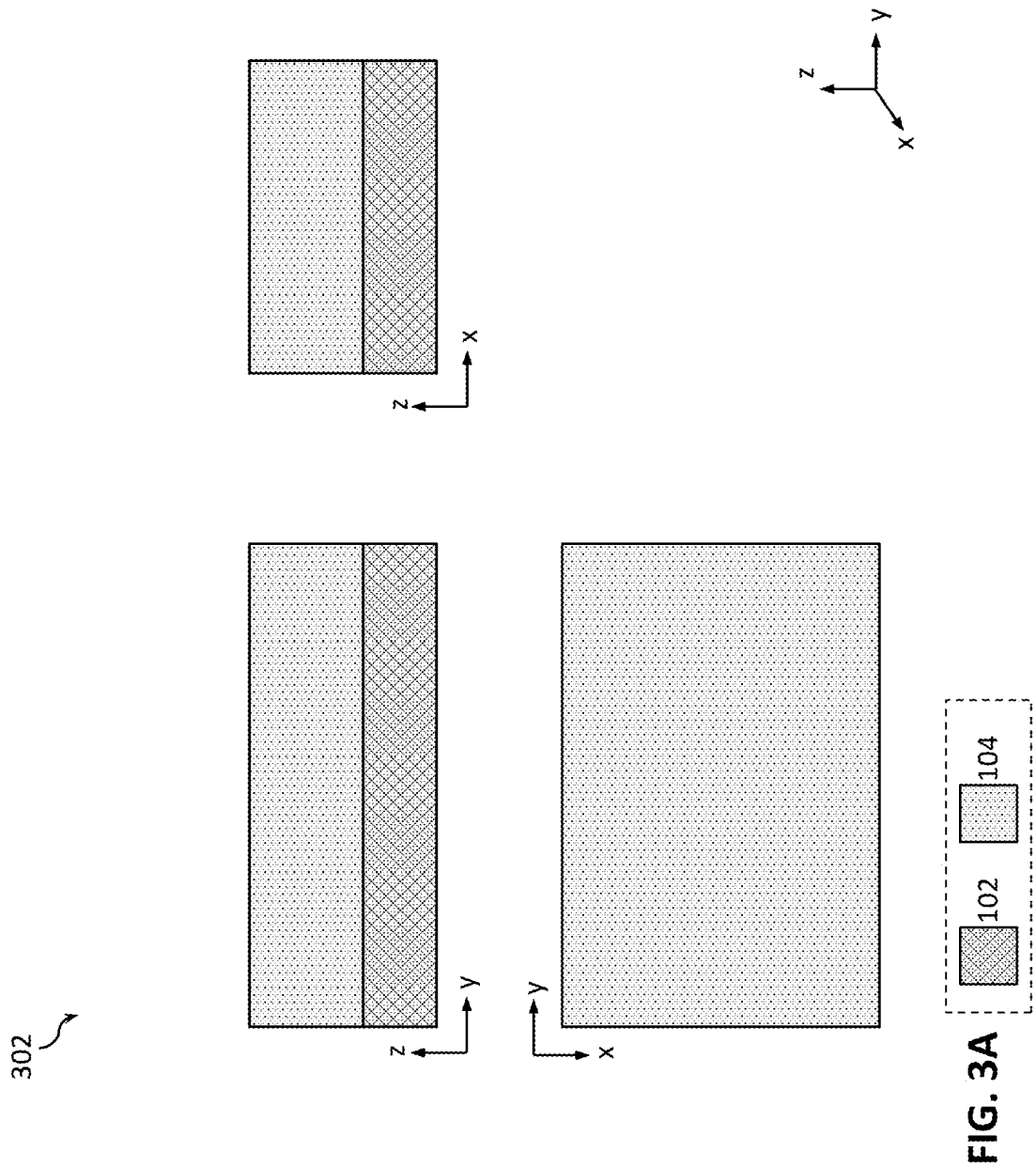
FIGS. 3A-3N illustrate various example stages in the fabrication of a nanowire TFT with a textured thin film semiconductor using the method shown in FIG. 2, in accordance with some embodiments of the present disclosure.
Figure 3B:
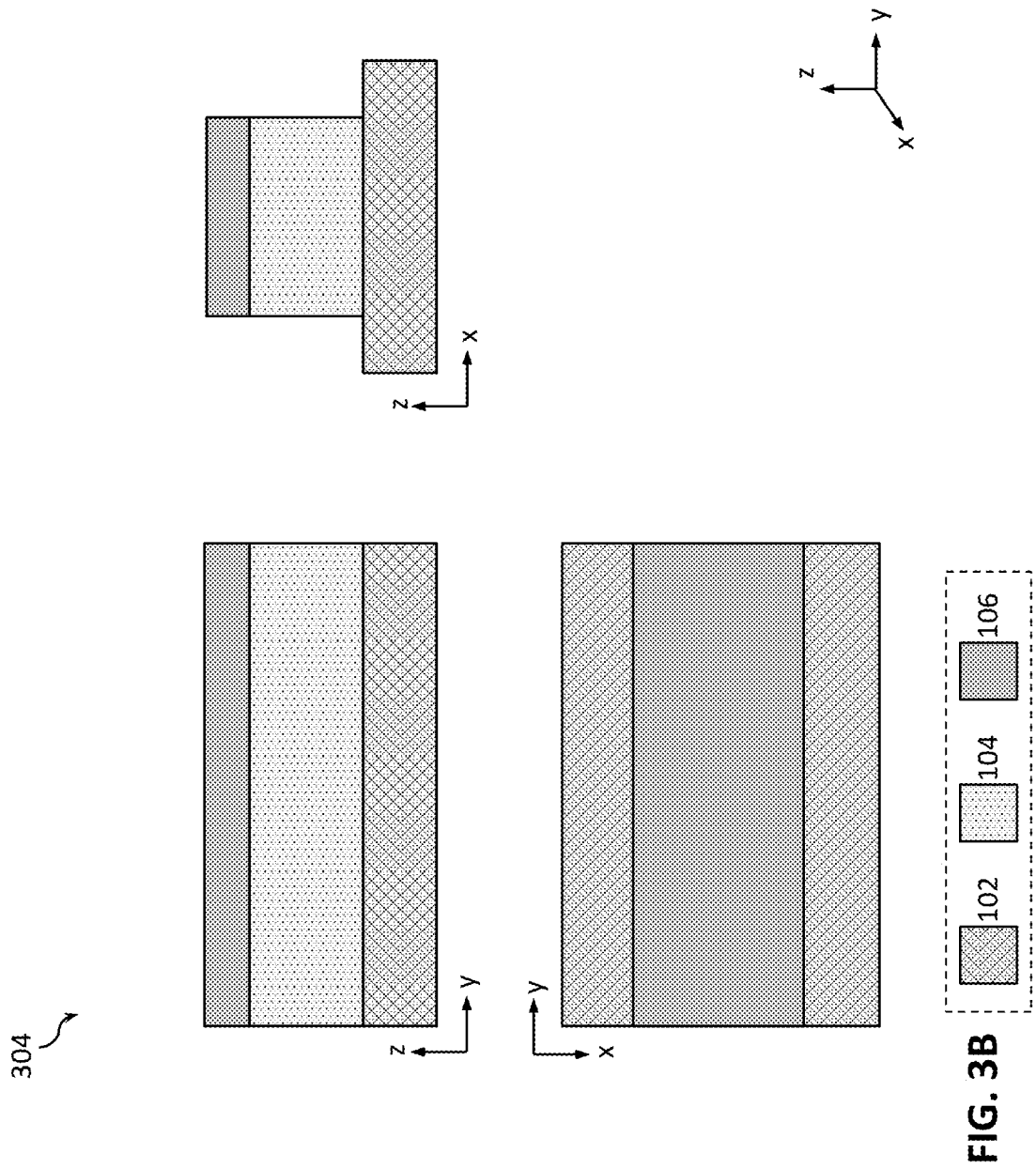
Figure 3C:
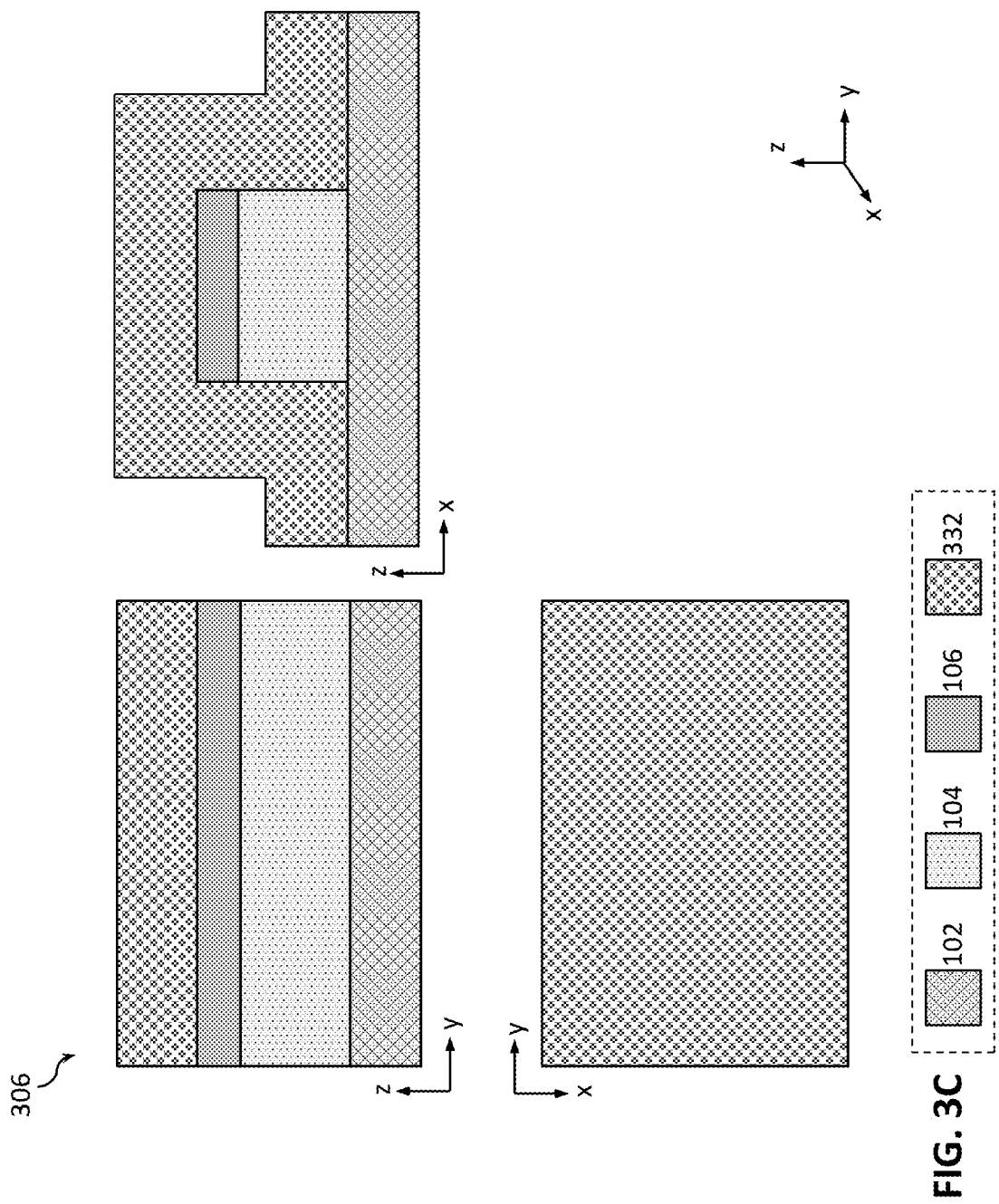

FIG. 2 is a flow diagram of an example method 200 for fabricating a nanowire TFT with a textured thin film semiconductor, in accordance with some embodiments of the present disclosure. Example device assemblies in various example stages during the manufacture using the method 200 are illustrated in FIGS. 3A-3N, in accordance with some embodiments of the present disclosure. Each of FIGS. 3A-3N provides three views of an exemplary nanowire TFT device assembly in various stages of fabrication according to the method 200 shown in FIG. 2. Namely, the top left view and the top right view of each of FIGS. 3A-3N are cross-sectional views of the assembly in the y-z and the x-z planes, respectively, while the bottom view of each of FIGS. 3A-3N is a top-down view of the assembly in the y-x plane (these views are analogous to those shown in FIG. 1). Similar to FIG. 1, a number of elements referred to in the description of FIGS. 3A-3N with reference numerals are indicated in these FIGS. with different patterns in order to not clutter the drawings, with a legend at the bottom of FIGS. 3A-3N showing the correspondence between the reference numerals and the patterns.

Various operations of the method 200 may be illustrated in FIGS. 3A-3N with some exemplary assemblies and explained with reference to some exemplary embodiments discussed below, but the method 200 may be used to manufacture any suitable nanowire TFT device assemblies with TFT nanowires according to any embodiments of the present disclosure. In addition, although the operations of the method 200 are illustrated in FIG. 2 once each and in a particular order, the operations may be performed in any suitable order and repeated as desired. For example, one or more operations may be performed in parallel to manufacture multiple nanowire TFT device assemblies as described herein substantially simultaneously. In another example, the operations may be performed in a different order to reflect the architecture of a particular device component in which one or more nanowire TFTs as described herein are to be included. In yet another example, some operations may be combined into a single operation, and some operations may be subdivided into more operations than what is shown in the present FIGS.

As shown in FIG. 2, the method 200 may begin with a process 202 that includes providing, over at least a portion of a substrate, a layer of a seed material. The substrate may be a substrate according to any of the embodiments of the substrate 102, described herein, while the seed material provided in the process 202 may be a seed material according to any of the embodiments of the seed material 104, also described herein. An exemplary result of the process 202 is illustrated with a device assembly 302 shown in FIG. 3A where a portion of the substrate 102 is covered with the seed material 104. Although not specifically shown in FIG. 3A and subsequent FIGS. 3B-3N, as described above with reference to the TFT 100 shown in FIG. 1, in other embodiments, further layers which are not specifically shown in the present FIGS. may be present between the substrate 102 and the seed layer 104 with the gate stack of the TFT 100, e.g., if the TFT 100 is implemented in one or more BEOL layers.

In various embodiments, the seed material 104 may have a thickness (i.e. a dimension measured along the z-axis of the example coordinate system shown in FIG. 3A) between about 5 and 50 nanometers, including all values and ranges therein. In various embodiments of the process 202, the seed material may be deposited using any suitable process, where a process may be selected based on, e.g., the type of material chosen for the seed material. Example processes for depositing the seed material in the process 202 include one or more of epitaxial growth, atomic layer deposition (ALD), chemical vapor deposition (CVD), and plasma-enhanced CVD (PECVD), reactive or physical sputtering.

The method 200 may then proceed with a process 204 that includes providing, over the seed layer provided in the process 202, a TFT channel material shaped as a wire over the seed layer. The TFT channel material provided in the process 204 may be a semiconductor material according to any of the embodiments of the channel material 106, described herein, and may be shaped as the nanowire 116, also described herein. An exemplary result of the process 204 is illustrated with a device assembly 304 shown in FIG. 3B where the nanowire 116 of the channel material 106 is provided over the seed material 104. In various embodiments, the nanowire 116 may be provided over the seed material 104 by, first, depositing a continuous layer of the channel material 106 over at least a portion of the seed material, and then patterning the layer of the channel material 106 to form the nanowire 116 of the desired dimensions (e.g., any of the dimensions described above). The seed material 104 may be patterned as well to conform to the x-y dimensions of the nanowire 116, as can be seen in the x-y view of FIG. 3B illustrating that patterning of the channel material 106 into the nanowire 116 is performed together with patterning of the seed material 104, so that, outside of the nanowire 116, the substrate 102 is exposed. At that point, the nanowire 116 is not yet released from the seed material 104, i.e., the nanowire 116 rests on the seed material 104. A release of at least a portion of the nanowire 116 is performed in the following process. The channel material 106 may be deposited in the process 204 using any suitable thin film deposition technique, e.g., sputtering, evaporation, molecular beam epitaxy (MBE), ALD, or CVD. A layer of the channel material may be patterned in the process 204 using any suitable patterning techniques, e.g., photolithographic or electron-beam patterning, possibly in combination with using a mask, e.g., a hardmask, and including a suitable etching process to remove portions of the channel material 106, e.g., using dry etch, reactive ion etch (RIE), etc.

Next, the method 200 may proceed with a process 206 that includes removing the seed material under at least a portion of the nanowire 116 of the channel material 106, thus releasing a portion of the nanowire 116, in order to provide space for a gate stack to wrap under the nanowire 116. The portion of the seed material removed in the process 206 may be of dimensions suitable to later house the bottom portion 123 of the gate electrode material 112 and the bottom portion of the gate dielectric 110 between the bottom portion 123 and the nanowire 116, as described herein. There are several ways how a person of ordinary skill in the art could provide a suitable opening in the seed material 104 under the nanowire 116, all of which being within the scope of the present disclosure. One example technique is illustrates in FIGS. 3C-3J, but, in general, embodiments of the nanowire TFT 100 or the method 200 are not limited to use of this example technique.

The example technique shown in FIGS. 3C-3J is based on the use of sacrificial materials and etching. First, a layer of sacrificial material may be deposited over the nanowire 116. An exemplary result of this process is illustrated with a device assembly 306 shown in FIG. 3C where a sacrificial material 332 is provided over the nanowire 116.

The sacrificial material 332 may include any material that has sufficient etch selectivity with respect to the substrate 102, the seed material 104, the channel material 106, the ILD 108, or material used for S/D spacers 337 described below because, in a later process, at least portions of the sacrificial material 332 will need to be etched without substantially etching these surrounding materials. As known in the art, two materials are said to have "sufficient etch selectivity" when etchants used to etch one material do not substantially etch the other, enabling selective etching of one material but not the other. In some embodiments, the sacrificial material 332 may be a sacrificial dielectric material. Some examples of such materials include a silicon oxide (i.e. a compound comprising silicon and oxygen, e.g. SiO2), a hafnium oxide (i.e. a compound comprising hafnium and oxygen e.g. HfO2), a silicon nitride (i.e. a compound comprising silicon and nitrogen, e.g. SiN), a silicon oxynitride (i.e. a compound comprising silicon, oxygen, and nitrogen, e.g. SiON), an aluminum oxide (i.e. a compound comprising aluminum and oxygen, e.g. $Al_2O_3$), an aluminum hafnium oxide (i.e. a compound comprising aluminum, hafnium, and oxygen, e.g. AlHfO), a carbon-doped oxide (i.e. a compound comprising carbon and oxygen), organic polymers such as perfluorocyclobutane or polytetrafluoroethylene, fluorosilicate glass (FSG), and organosilicates such as silsesquioxane, siloxane, or organosilicate glass. Besides appropriate etching characteristics, some other considerations in selecting a suitable sacrificial material 332 may include e.g. possibilities of smooth film formation, low shrinkage and outgassing, and good dielectric properties (such as e.g. low electrical leakage, suitable value of a dielectric constant, and thermal stability). Any suitable deposition techniques may be used to provide the sacrificial material 332, such as e.g. spin-coating, dip-coating, ALD, CVD, PECVD, and thermal oxidation.

Figure 3D:
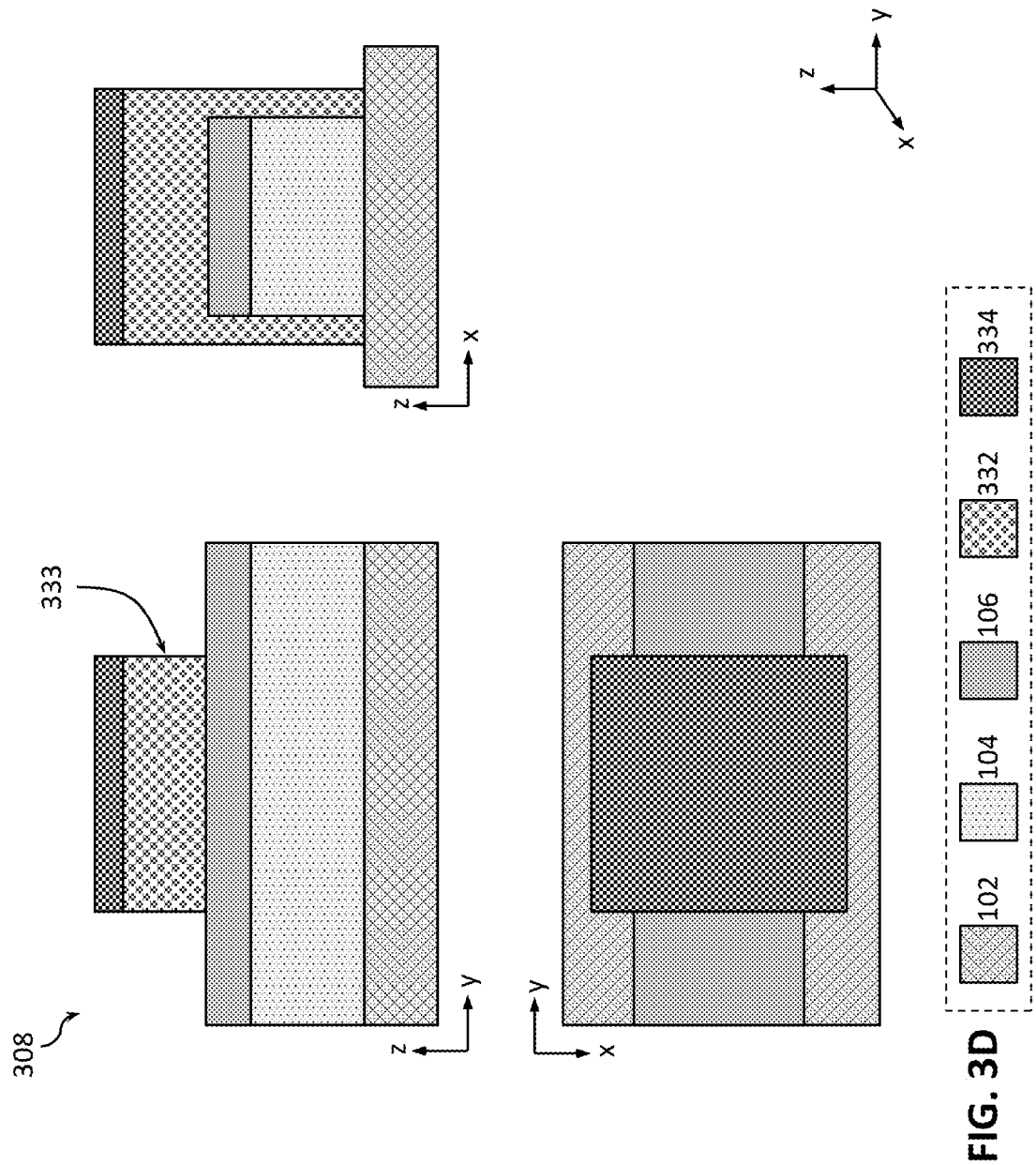

Next, the layer of the sacrificial material 332 may be patterned, e.g., using a hardmask 334, an example result of which is illustrated with a device assembly 308 shown in FIG. 3D, showing that the sacrificial material 332 is patterned into what may be referred to as a "sacrificial gate" 333. Any of example patterning techniques described above may be used to pattern the sacrificial material 332.

Figure 3E:
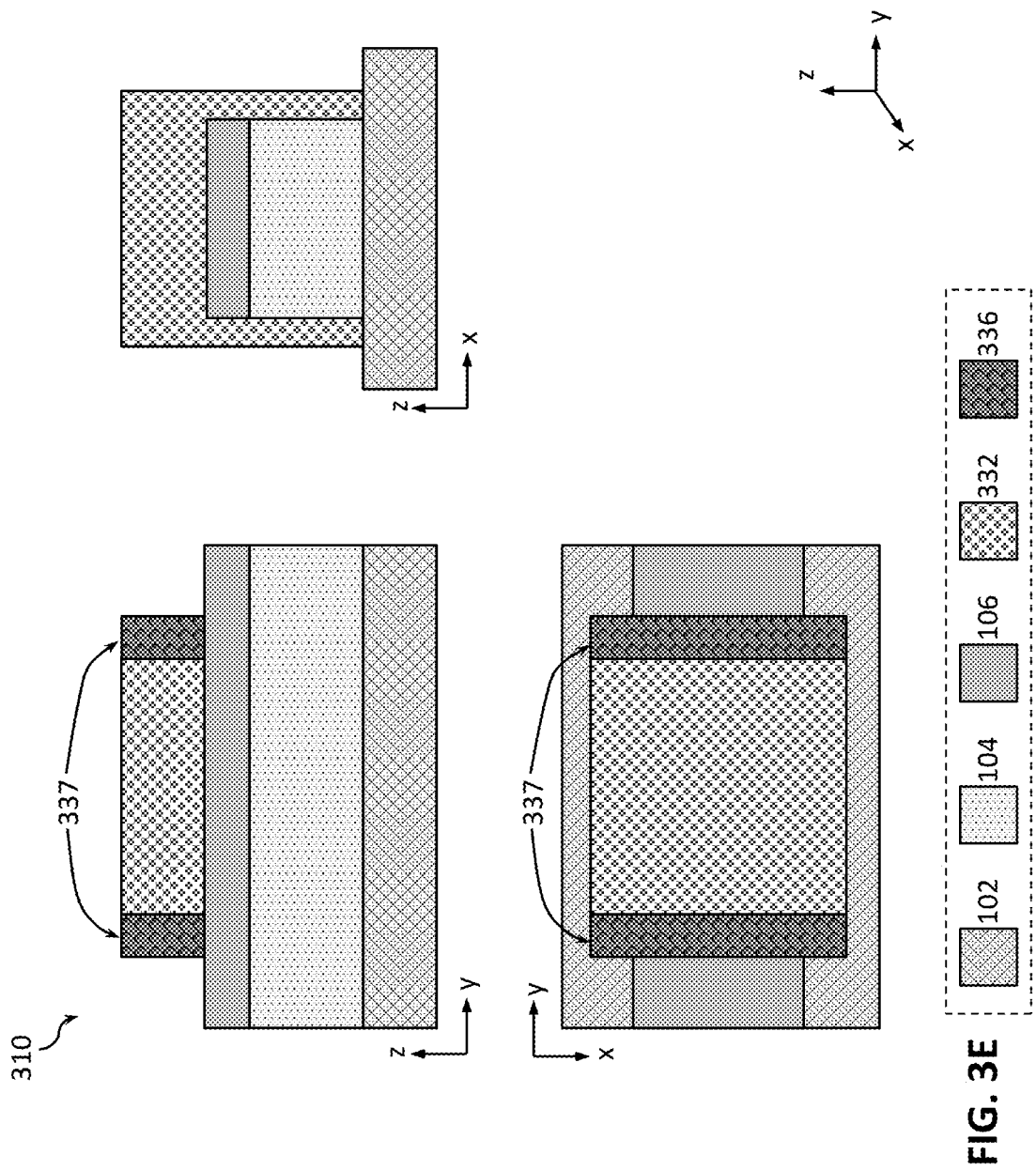

Subsequently, the hardmask 334 may be removed, and the method may include a process of depositing a patterning a spacer material for future self-aligned S/D contacts. An exemplary result of this process is illustrated with a device assembly 310 shown in FIG. 3E illustrating a spacer material 336 patterned into what may be referred to as "S/D spacers" 337. The spacer material 336 may first be deposited uniformly and then patterned into the S/D spacers 337 to be substantially on the sides of the views in y-z and y-x planes, in the desired locations for future S/D contacts. Any of example patterning techniques described above may be used to pattern the spacer material 336. The spacer material 336 may include any suitable material, e.g., any of the materials described above with reference to the sacrificial material 332, as long as the spacer material 336 is chosen so that it has sufficient etch selectivity with respect to the material chosen for the sacrificial material 332.

Figure 3F:
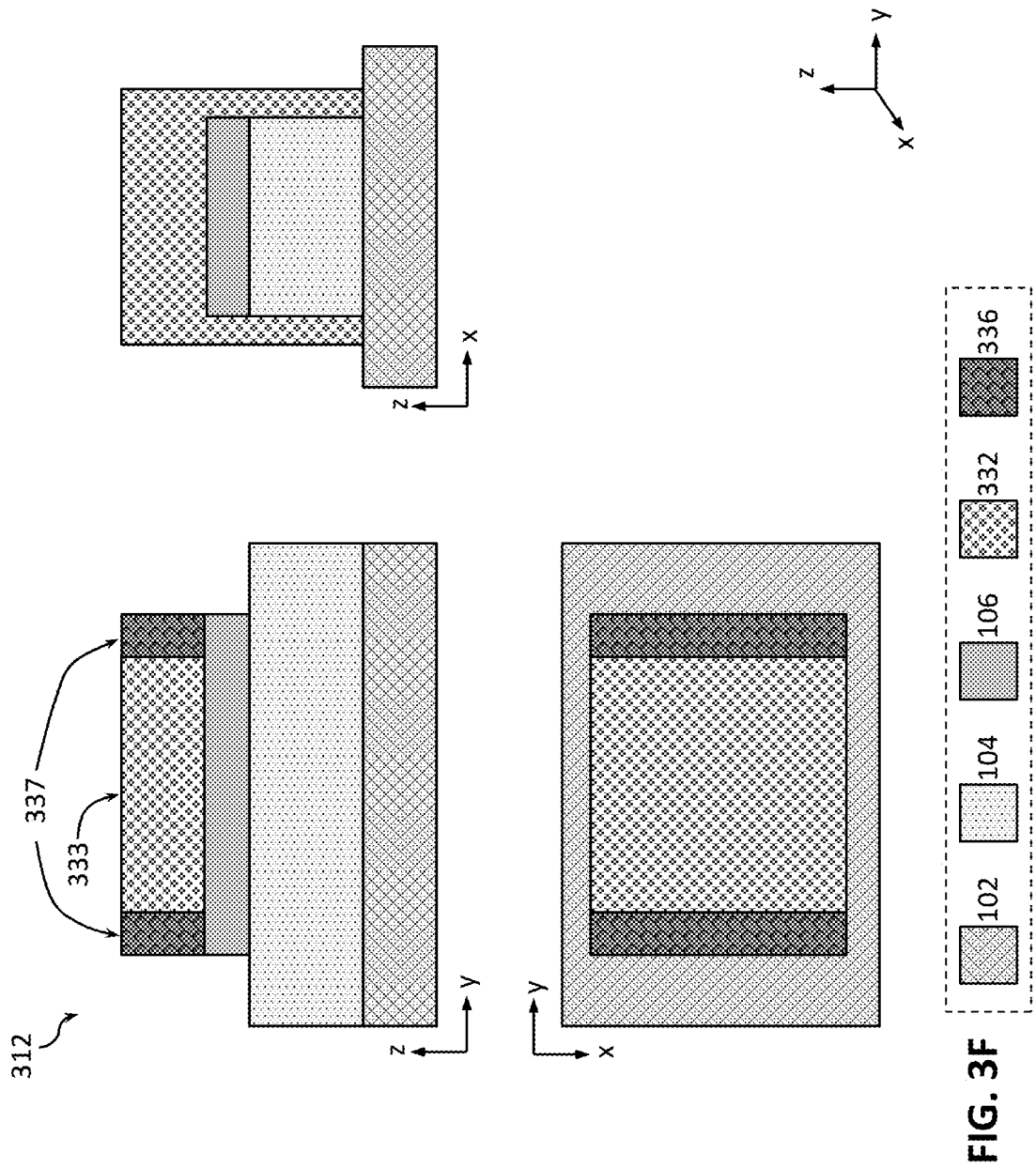
Figure 3H:
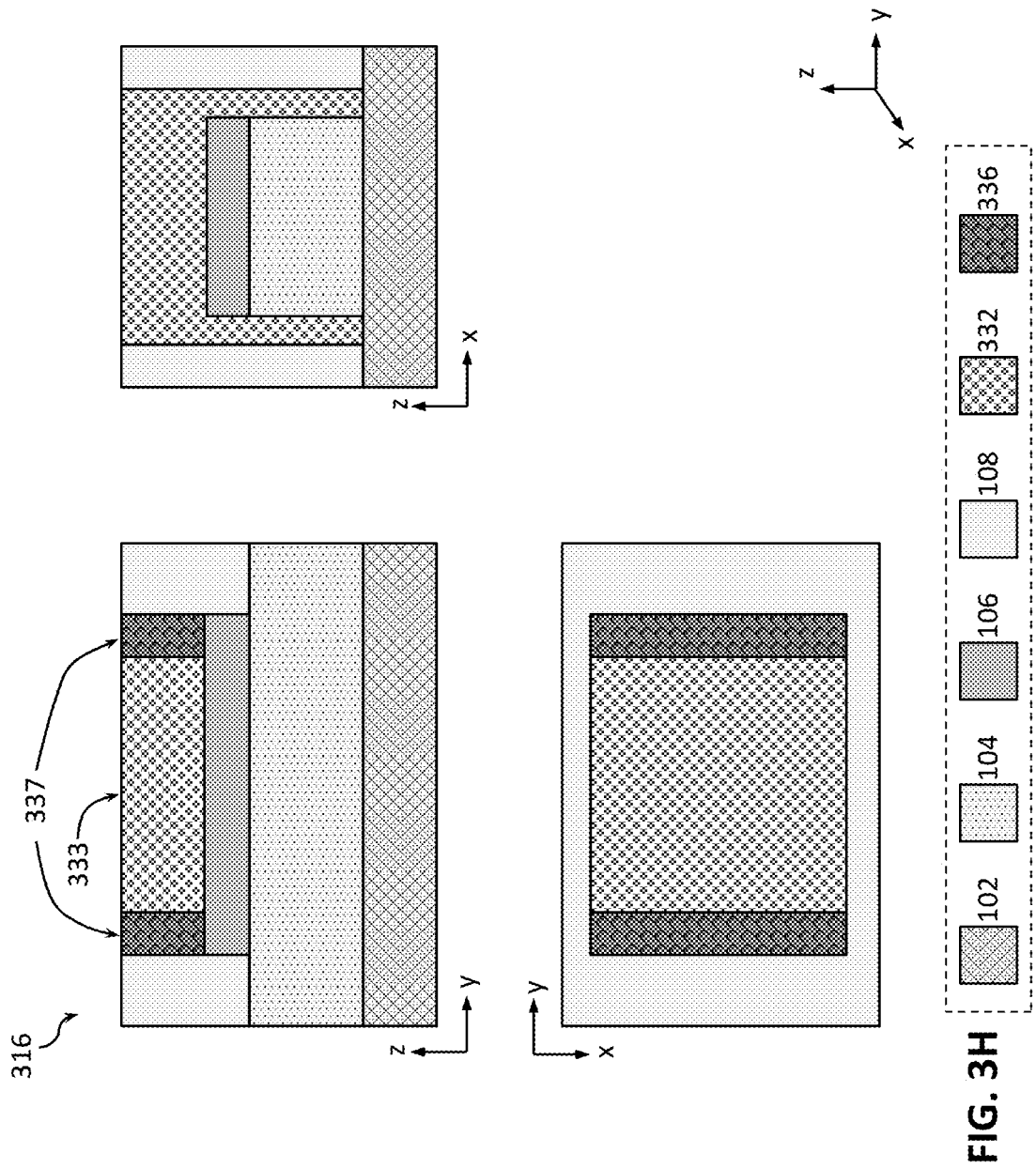

Next, the channel material 106 of the nanowire 116 may be pattered using the sacrificial gate 333 and the S/D spacers 337 as a mask, an example result of which is illustrated with a device assembly 312 shown in FIG. 3F. To that end, any suitable etching technique, e.g., any suitable anisotropic etching technique, may be used to remove portions of the nanowire 116 not covered by the sacrificial material 332 and the spacer 336, e.g., using wet etch, dry etch, RIE, or a combination of above methods.

A dielectric material may then be deposited to cover the device assembly 312. An exemplary result of this process is illustrated with a device assembly 314 shown in FIG. 3G illustrating the ILD 108 deposited over the previous device assembly 312. The ILD 108 may be deposited using, e.g., spin-coating, dip-coating, ALD, CVD, or PECVD.

The device assembly with the ILD 108 may subsequently be planarized/polished to remove excess of the ILD 108 on top of the assembly and expose the sacrificial gate 333 and S/D spacers 337 for the subsequent etching. An exemplary result of this process is illustrated with a device assembly 316 shown in FIG. 3H. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of the ILD 108 which may cover upper surfaces of the sacrificial gate 333 and S/D spacers 337 to expose such surfaces for the subsequent etch.

Next, the sacrificial gate 333 may be removed. An exemplary result of this process is illustrated with a device assembly 318 shown in FIG. 3I. To that end, any suitable etching techniques for removing the sacrificial material 332 without substantially removing the S/D spacers 337, the ILD 108, the channel material 106, the seed material 104, or the substrate 102 may be used, e.g., any suitable dry or wet etching techniques. Provided that substantially all of the sacrificial material 332 is etched out in this process, the shape and dimensions of the resulting opening 339 will be those defined by the surrounding structures.

As can be seen in the x-y view of FIG. 3I, the opening 339 exposes surfaces 341 of the seed material 104. These surfaces can be used to remove a portion of the seed material under the nanowire 116 in the next process that includes etching of the seed material 104 through the opening 339. An exemplary result of this process is illustrated with a device assembly 320 shown in FIG. 3J. In some embodiments, the etch of this process may include an isotropic etch, such as e.g. an isotropic wet etch. Isotropic etching etches in multiple directions (both vertically and horizontally), unlike e.g. dry etching which only substantially etches in a single direction, and, therefore, can be used to achieve undercutting of the seed material 104 under the nanowire 116 of the channel material 106, thereby providing a void or a gap under the bottom part of the nanowire 116, forming a cavity 343, e.g., between the bottom part of the nanowire 116 and the substrate 102 (if the seed material under the nanowire 116 is removed all the way down to the substrate 102, which, in various embodiments, may or may not be the case). Any substance suitable for isotropically etching the seed material 104 may be used in this process. In various embodiments, an etchant may be e.g. corrosive liquid, such as e.g. hydrofluoric acid (HF) or a chemically active ionized gas (i.e. plasma).

Figure 3J:
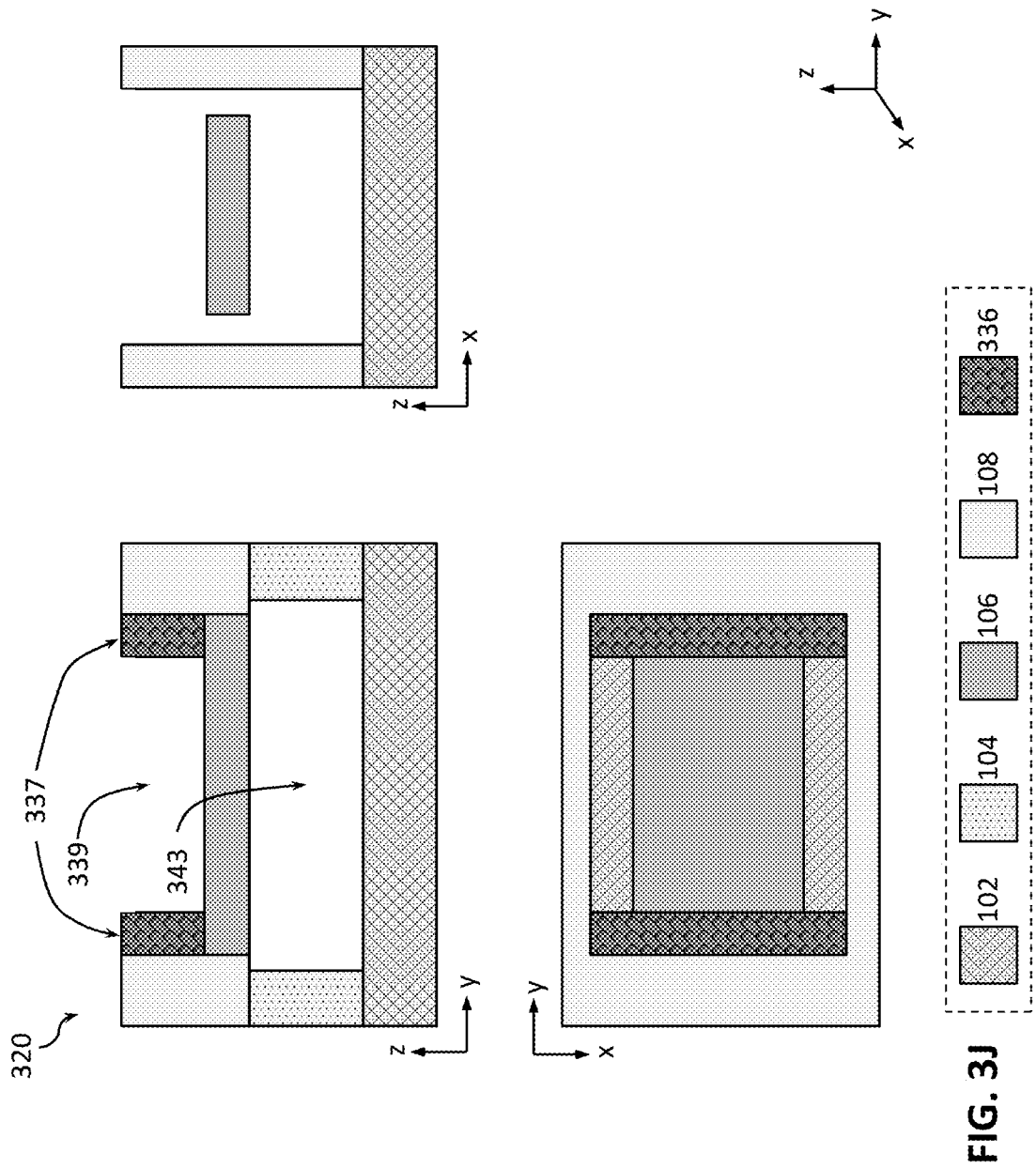
Figure 3K:
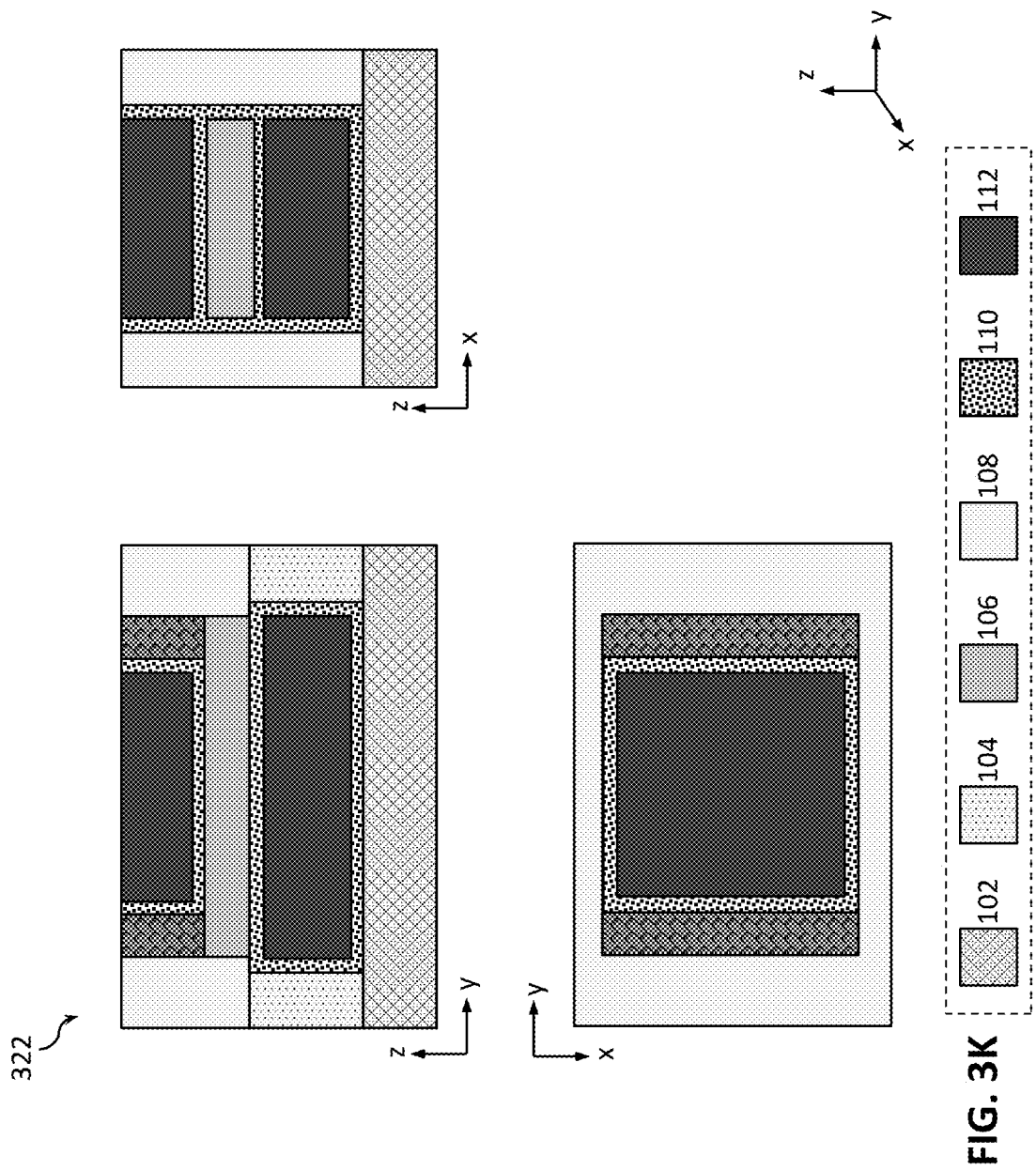

Turning back to FIG. 2, once the seed material 104 has been removed in the process 206 so that a cavity that wraps around a portion of the nanowire 116 is formed as shown in FIG. 3J, the method may proceed with a process 208 that includes providing a gate dielectric within said cavity, and then filling the cavity lined with the gate dielectric with a gate electrode material, thus providing a gate dielectric and a gate electrode material wrapping around the nanowire 116 of the channel material 106. An exemplary result of this process is illustrated with a device assembly 322 shown in FIG. 3K, illustrating the gate dielectric 110 and the gate electrode material 112, as described above. The gate dielectric 110 may be deposited using any suitable conformal deposition process, e.g., ALD, so that all exposed surfaces in the opening 339 and cavity 341 could be covered with the gate dielectric 110; the gate electrode material 112 may be deposited using known processes for filling conductive materials, e.g., ALD, CVD, or physical vapor deposition (PVD).

Figure 3L:
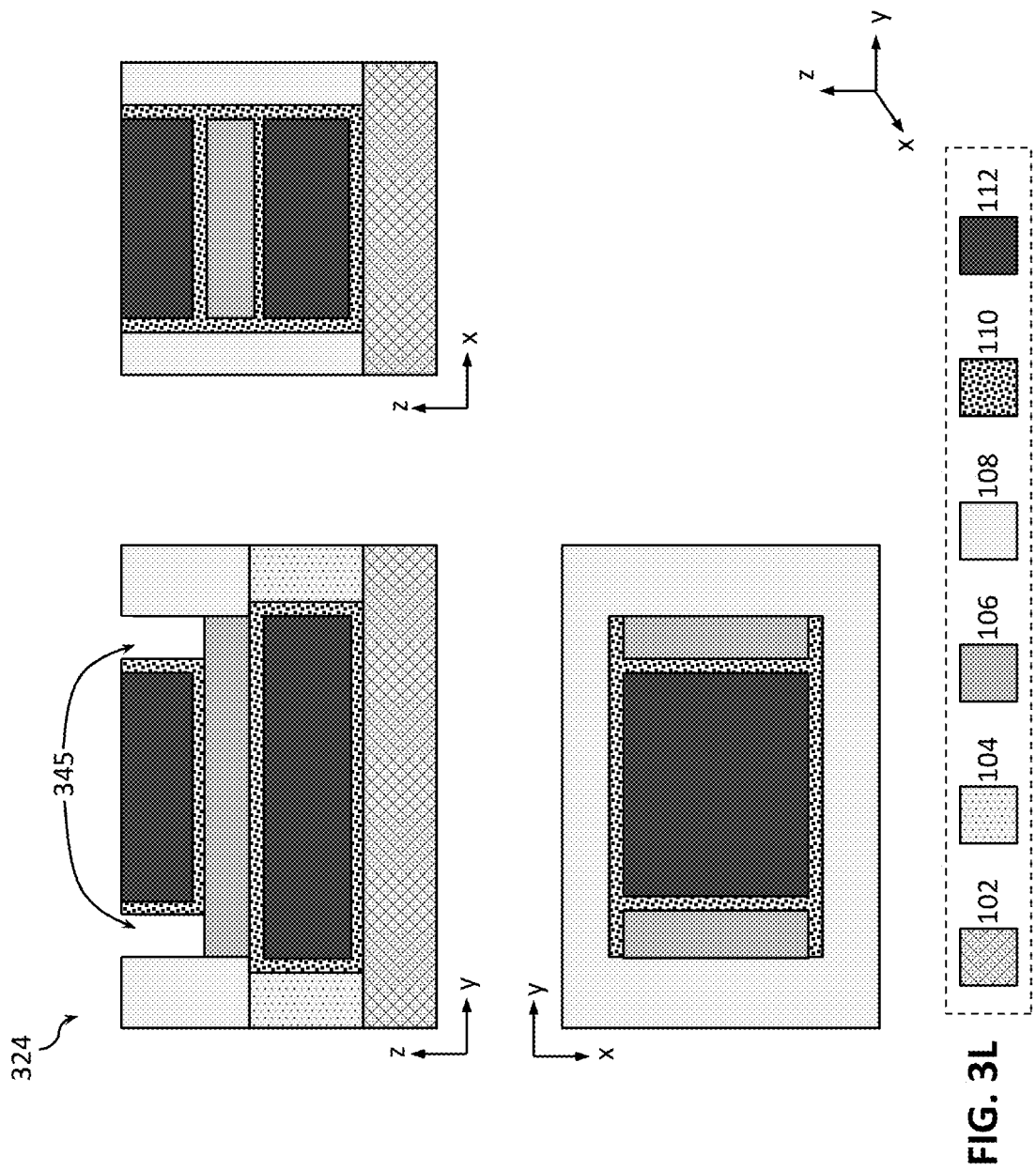
Figure 3N:
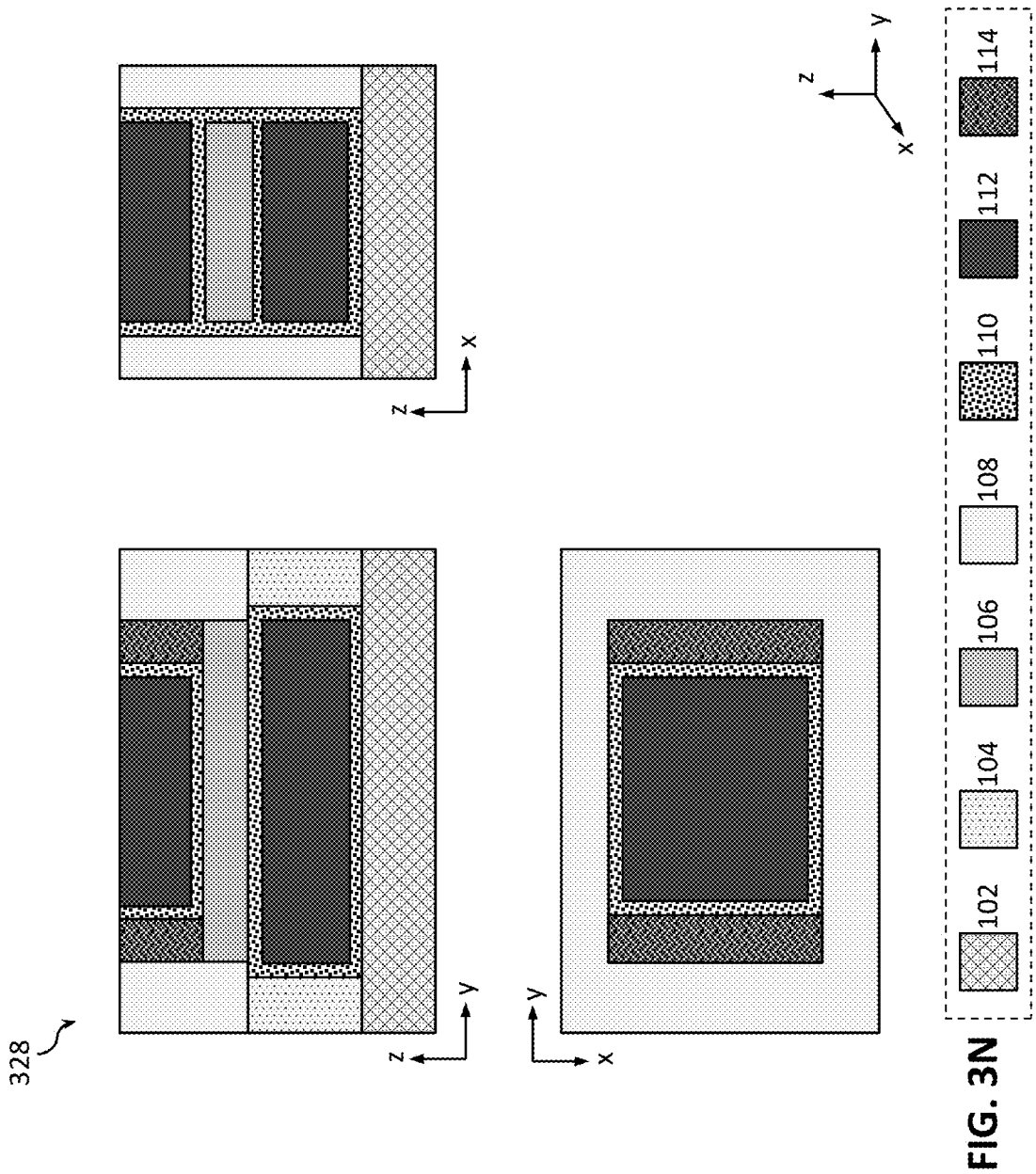

The method 200 may conclude with providing S/D contacts in a process 210. In some of the embodiments where the method for forming an opening in the seed layer as shown in FIGS. 3C-3J is used, providing S/D contacts in the process 210 may take place as shown in FIGS. 3L-3N.

In a first stage of providing the S/D contacts in the process 210, the S/D spacers 337 may be removed. An exemplary result of this process is illustrated with a device assembly 324 shown in FIG. 3L. This may be done using any suitable etching process that would remove the spacer material 336 without substantially etching the channel material 106 the substrate 102, the gate dielectric 110, or the gate electrode material 112, e.g., any of the etching processes described above. Provided that substantially all of the spacer material 336 is etched out in this process, the shape and dimensions of the resulting openings 345 over the nanowire 116 would be those defined by the surrounding structures. In this manner, the openings 345 may be self-aligned over the nanowire 116.

In a second stage of providing the S/D contacts in the process 210, the openings 345 may be filled with a conductive material of the S/D contacts. An exemplary result of this process is illustrated with a device assembly 326 shown in FIG. 3M, illustrating that the openings 345 are filled with the electrically conductive material of the S/D contacts 114. This may be done using any suitable deposition process, e.g., ALD, CVD, or PVD.

In a third stage of providing the S/D contacts in the process 210, planarization of the device assembly 326 may be performed, if needed, to remove the overburden of the electrically conductive material of the S/D contacts 114 to expose the gate electrode material 112. An exemplary result of this process is illustrated with a device assembly 328 shown in FIG. 3N (which is substantially the same as the nanowire TFT 100 shown in FIG. 1). Planarization may be performed using either wet or dry planarization processes, e.g. CMP, using a polishing surface, an abrasive and a slurry to remove the overburden of the electrically conductive material of the S/D contacts 114.

In various embodiments, the manufacturing method 200 may include other operations, not specifically shown in FIG. 2 or FIGS. 3A-3N, such as e.g. various cleaning operations as known in the art. For example, in some embodiments, the nanowire TFT device assembly may be cleaned prior to or/and after any of the processes of the method 200 described herein, e.g. to remove surface-bound organic and metallic contaminants, as well as subsurface contamination, to promote adhesion, and/or to decrease interdiffusion of materials. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In some embodiments, cleaning may be carried out using chemical or plasma clean, or applying heat in a controlled environment.

Advantages of at least some embodiments of the method 200 described above include ability to provide a GAA or bottom-gate nanowire TFTs with textured semiconductor channel materials and self-alignment of S/D contacts over the thin film nanowire.

Example Devices and Components

Arrangements with nanowire TFTs with textured thin film semiconductors as disclosed herein may be included in any suitable electronic device. FIGS. 4-8 illustrate various examples of devices and components that may include one or more nanowire TFTs with textured thin film semiconductors as disclosed herein.

FIGS. 4A-4B are top views of a wafer 2000 and dies 2002 that may include one or more nanowire TFTs with textured thin film semiconductors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more nanowire TFTs with textured thin film semiconductors as described herein). After the fabrication of the semiconductor product is complete (e.g., after manufacture of nanowire TFTs with textured thin film semiconductors as described herein), the wafer 2000 may undergo a singulation process in which each of the dies 2002 is separated from one another to provide discrete "chips" of the semiconductor product. In particular, devices that include one or more nanowire TFTs with textured thin film semiconductors as disclosed herein may take the form of the wafer 2000 (e.g., not singulated) or the form of the die 2002 (e.g., singulated). The die 2002 may include one or more transistors (e.g., one or more nanowire TFTs with textured thin film semiconductors as described herein and/or one or more of the transistors 2140 of FIG. 5, discussed below) and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG.

8) or other logic that is configured to store information in the memory devices or execute instructions stored in the memory array.

Figure 5:
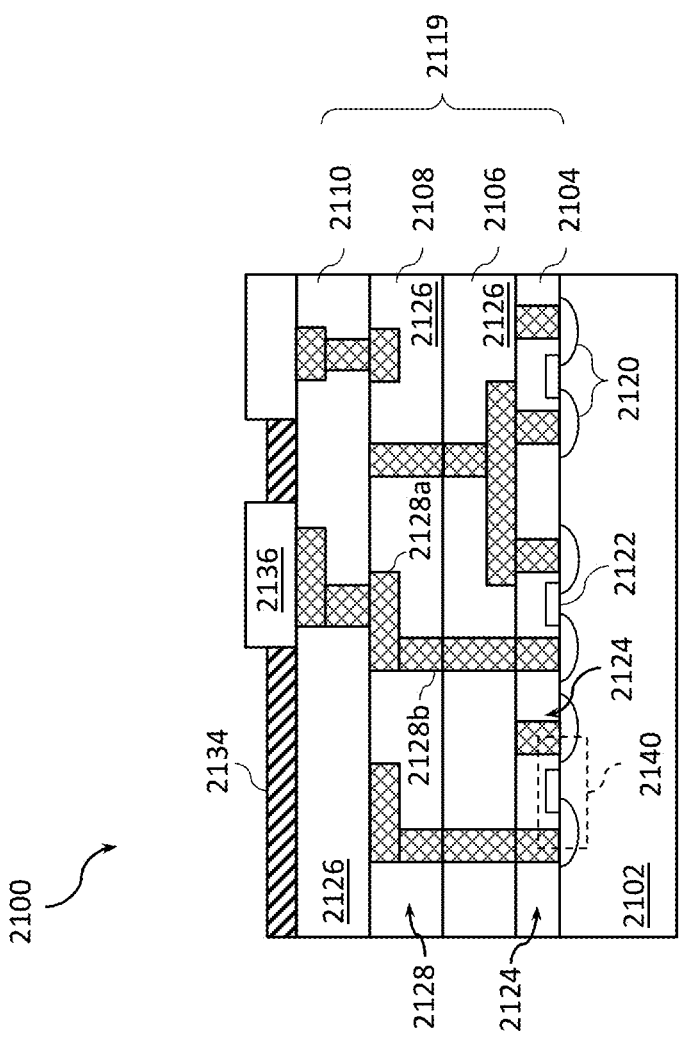
FIG. 5 is a cross-sectional side view of an integrated circuit (IC) device that may include one or more nanowire TFTs with textured thin film semiconductors in accordance with any of the embodiments disclosed herein.

FIG. 5 is a cross-sectional side view of an IC device 2100 that may include one or more nanowire TFTs with textured thin film semiconductors in accordance with any of the embodiments disclosed herein. For example, the IC device 2100 may include one or more nanowire TFTs with textured thin film semiconductors, e.g. one or more nanowire TFTs 100, implemented in any of the FEOL layers (e.g., in any of the device layers 2104), and/or implemented in any of the BEOL layers (e.g., in any of the interconnect layers 2106-2110). Because there are various possibilities where such nanowire TFTs may be integrated in the IC device 2100, the nanowire TFTs are not specifically shown in FIG. 5. In some embodiments, the IC device 2100 may serve as any of the dies 2256 in the IC package 2300.

As shown in FIG. 5, the IC device 2100 may be formed on a substrate 2102 (e.g., the wafer 2000 of FIG. 4A) and may be included in a die (e.g., the die 2002 of FIG. 4B). The substrate 2102 may include any material that may serve as a foundation for an IC device 2100. The substrate 2102 may be a semiconductor substrate, and may be implemented as any of the examples provided above with reference to the substrate 102. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 4B) or a wafer (e.g., the wafer 2000 of FIG. 4A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 110. In some embodiments, an annealing process may be carried out on the gate dielectric of the gate 2122 to improve its quality when a high-k material is used.

The gate electrode may be formed on the gate dielectric and may include at least one P-type work function metal or n-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 112.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 5 and may include a wide variety of other types and configurations such as, for example, planar transistors, non-planar transistors, or a combination of both. In particular, any of the transistors 2140 may be implemented as, or replaced with, nanowire TFTs with textured thin film semiconductors as described herein, e.g., GAA or bottom-gate nanowire TFTs with textured thin film semiconductors.

Electrical signals, such as power and/or input/output (I/O) signals, may be routed to and/or from the transistors 2140 of the device layer 2104 through one or more interconnect layers disposed on the device layer 2104 (illustrated in FIG. 5 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 5). Although a particular number of interconnect layers 2106-1210 is depicted in FIG. 5, embodiments of the present disclosure include IC devices having more or fewer interconnect layers than depicted.

In some embodiments, the interconnect structures 2128 may include trench structures 2128a (sometimes referred to as "lines") and/or via structures 2128b (sometimes referred to as "holes") filled with an electrically conductive material such as a metal. The trench structures 2128a may be arranged to route electrical signals in a direction of a plane that is substantially parallel with a surface of the substrate 2102 upon which the device layer 2104 is formed. For example, the trench structures 2128a may route electrical signals in a direction in and out of the page from the perspective of FIG. 5. The via structures 2128b may be arranged to route electrical signals in a direction of a plane that is substantially perpendicular to the surface of the substrate 2102 upon which the device layer 2104 is formed. In some embodiments, the via structures 2128b may electrically couple trench structures 2128a of different interconnect layers 2106-2110 together.

The interconnect layers 2106-2110 may include a dielectric material 2126 disposed between the interconnect structures 2128, as shown in FIG. 5. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 6:
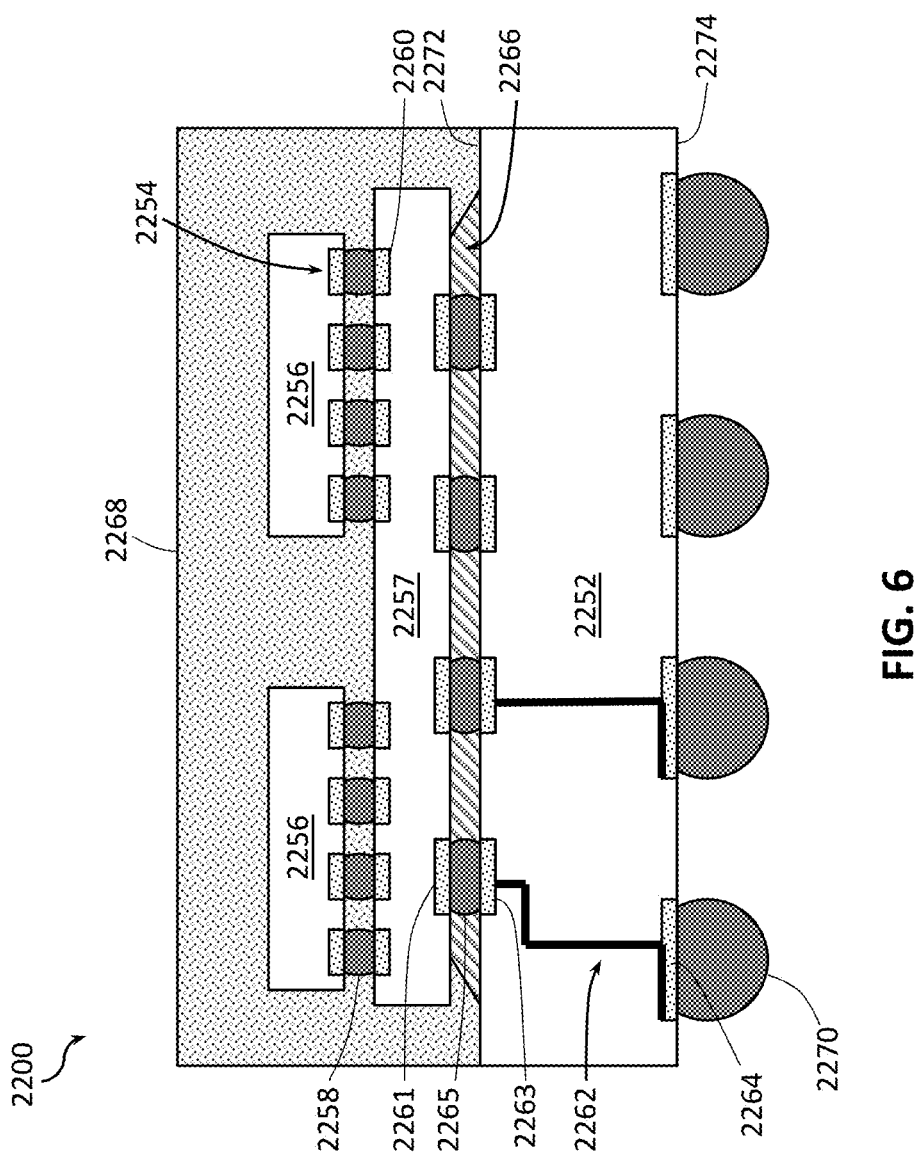
FIG. 6 is a cross-sectional side view of an IC package that may include one or more nanowire TFTs with textured thin film semiconductors in accordance with any of the embodiments disclosed herein.

FIG. 6 is a side, cross-sectional view of an example IC package 2200 that may include one or more nanowire TFTs with textured thin film semiconductors in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 5.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, any of the dies 2256 may include one or more nanowire TFTs with textured thin film semiconductors, e.g., as discussed above with reference to FIG. 4 and FIG. 5; in some embodiments, at least some of the dies 2256 may not include any nanowire TFTs with textured thin film semiconductors.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 7:
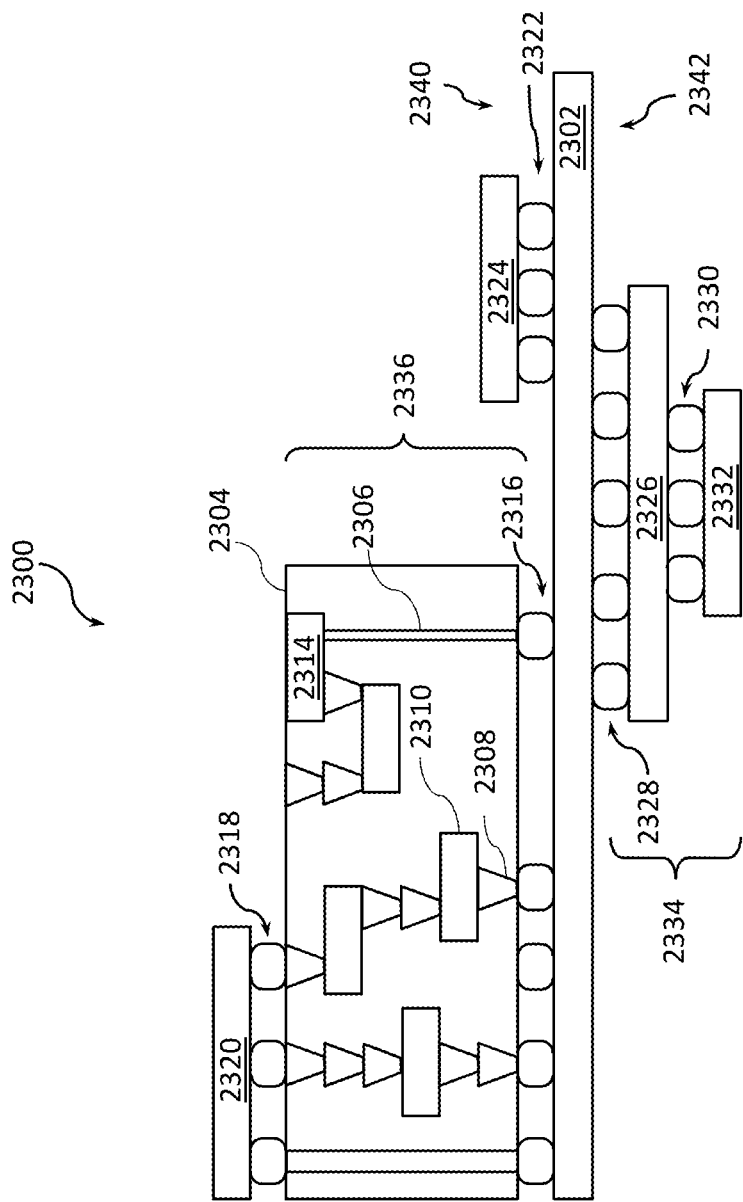
FIG. 7 is a cross-sectional side view of an IC device assembly that may include one or more nanowire TFTs with textured thin film semiconductors in accordance with any of the embodiments disclosed herein.

FIG. 7 is a cross-sectional side view of an IC device assembly 2300 that may include components having one or more nanowire TFTs with textured thin film semiconductors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more nanowire TFTs with textured thin film semiconductors in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more nanowire TFTs with textured thin film semiconductors on/over/in a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 4B), an IC device (e.g., the IC device 2100 of FIG. 5), or any other suitable component. In particular, the IC package 2320 may include one or more nanowire TFTs with textured thin film semiconductors as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 8:
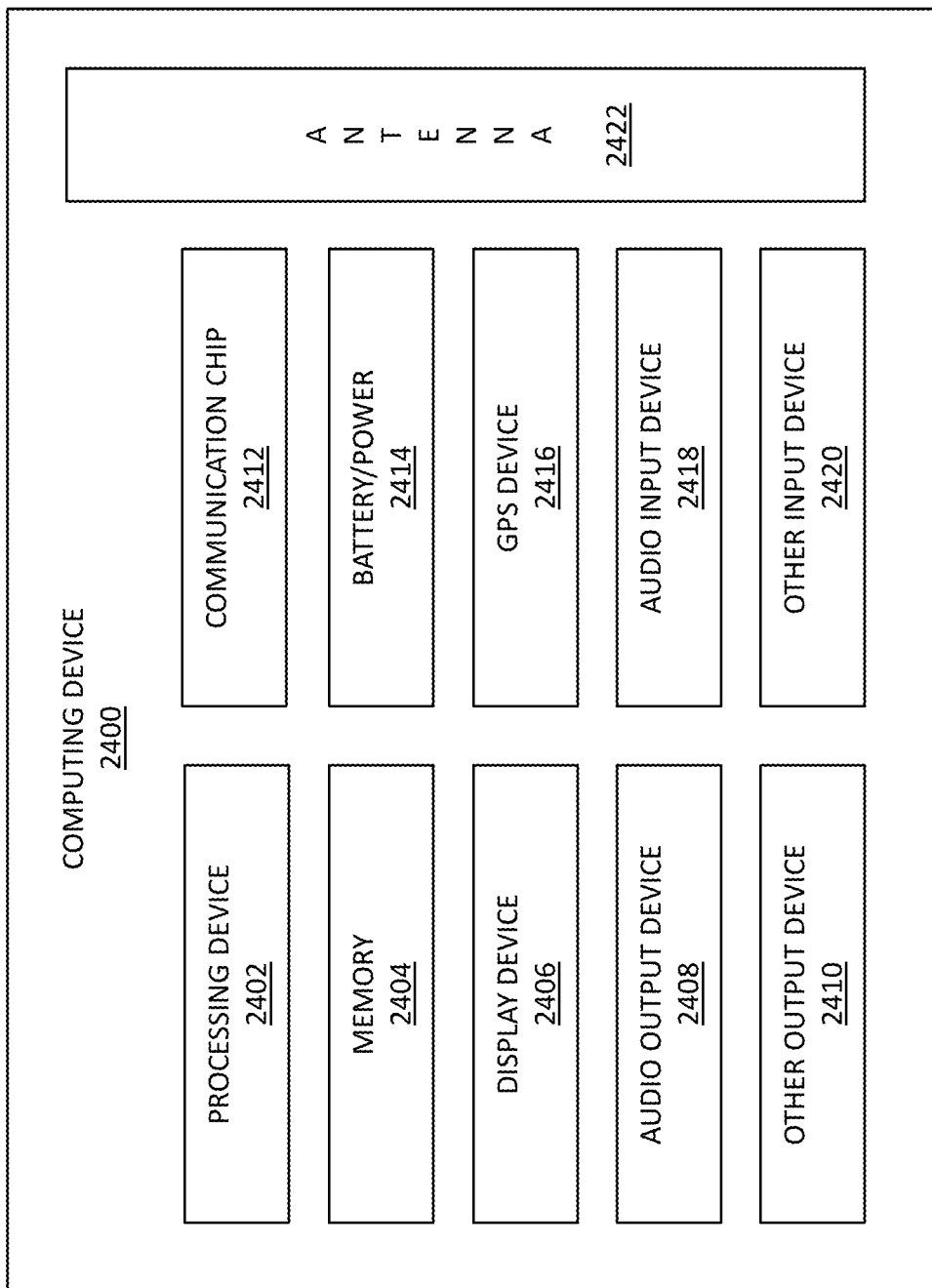
FIG. 8 is a block diagram of an example computing device that may include one or more nanowire TFTs with textured thin film semiconductors in accordance with any of the embodiments disclosed herein.

FIG. 8 is a block diagram of an example computing device 2400 that may include one or more components with one or more nanowire TFTs with textured thin film semiconductors in accordance with any of the embodiments disclosed herein. For example, any suitable ones of the components of the computing device 2400 may include a die (e.g., the die 2002 (FIG. 4B)) including one or more nanowire TFTs with textured thin film semiconductors in accordance with any of the embodiments disclosed herein. Any of the components of the computing device 2400 may include an IC device 2100 (FIG. 5) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a TFT gate-channel arrangement that includes a substrate and a channel material shaped as a wire, where the channel material includes a thin film semiconductor material. The arrangement further includes a gate stack having a gate electrode material and a gate dielectric between the channel material and the gate electrode material, where the gate dielectric at least partially wraps around the wire. The gate electrode material includes a bottom portion including a portion of the gate electrode material between the channel material and the substrate, the bottom portion of the gate electrode material disposed in a layer of a seed material disposed over the substrate (i.e., the layer of the seed material is a layer below the wire of the channel material).

Example 2 provides the TFT gate-channel arrangement according to example 1, where a portion of the gate dielectric is between the bottom portion of the gate electrode material and the channel material, and the TFT gate-channel arrangement further includes a further portion of the gate dielectric between the bottom portion of the gate electrode material and the substrate.

Example 3 provides the TFT gate-channel arrangement according to examples 1 or 2, where the seed material includes a dielectric or a conductive material including one or more of oxygen and one or more of hafnium, aluminum, zirconium, indium, gallium, zinc, and silicon (i.e., one or more oxides of these materials); and nitrogen and one or more of hafnium, aluminum, zirconium, indium, gallium, zinc, and silicon (i.e., one or more nitrides of these materials).

Example 4 provides the TFT gate-channel arrangement according to any one of the preceding examples, where the bottom portion of the gate electrode material is disposed in an opening in the seed material.

Example 5 provides the TFT gate-channel arrangement according to example 4, where the opening is lined with the gate dielectric.

Example 6 provides the TFT gate-channel arrangement according to example 5, where a portion of the gate dielectric lining the opening is in contact with the seed material.

Example 7 provides the TFT gate-channel arrangement according to any one of the preceding examples, where the channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, and black phosphorus.

Example 8 provides the TFT gate-channel arrangement according to any one of the preceding examples, where the gate dielectric includes a high-k dielectric.

Example 9 provides the TFT gate-channel arrangement according to any one of the preceding examples, where the gate dielectric includes one or more of a high-k dielectric material including hafnium and oxygen (e.g., hafnium oxide), a high-k dielectric material including zirconium and oxygen (e.g., zirconium oxide), a high-k dielectric material including aluminum and oxygen (e.g., aluminum oxide), a high-k dielectric material including tantalum and oxygen (e.g., tantalum oxide), a high-k dielectric material including tantalum, silicon, and oxygen (e.g., tantalum silicon oxide), a high-k dielectric material including hafnium, silicon, and oxygen (e.g., hafnium silicon oxide), and a high-k dielectric material including lanthanum and oxygen (e.g., lanthanum oxide).

Example 10 provides the TFT gate-channel arrangement according to any one of the preceding examples, where the gate dielectric has a thickness between 0.5 and 10 nanometers.

Example 11 provides the TFT gate-channel arrangement according to any one of the preceding examples, where the gate dielectric wraps at least partially, or entirely around the wire.

Example 12 provides the TFT gate-channel arrangement according to any one of the preceding examples, where a cross-section of the wire taken along a plane perpendicular to a long axis of the wire is between about 1 and 500 square nanometers, including all values and ranges therein, e.g. between about 50 and 250 square nanometers, or between about 100 and 200 square nanometers.

Example 13 provides the TFT gate-channel arrangement according to any one of the preceding examples, where a shape of a cross-section of the wire taken along a plane perpendicular to a long axis of the wire is a rectangle or a trapezoid.

Example 14 provides a transistor that includes a channel material shaped as a wire, where the channel material includes a textured thin film semiconductor material; a gate electrode material; a gate dielectric between the channel material and the gate electrode material, where the gate dielectric at least partially wraps around the wire; a first source/drain (S/D) electrode provided over the channel material; and a second S/D electrode provided over the channel material.

Example 15 provides the transistor according to example 14, where the first S/D electrode is substantially aligned with a first end of the wire.

Example 16 provides the transistor according to examples 14 or 15, where the second S/D electrode is substantially aligned with a second end of the wire.

Example 17 provides the transistor according to any one of examples 14-16, where at least one of the first S/D electrode and the second S/D electrode includes a metal.

Example 18 provides the transistor according to any one of examples 14-16, where at least one of the first S/D electrode and the second S/D electrode includes a semiconductor and an N-type dopant.

Example 19 provides the transistor according to any one of examples 14-18, where the channel material, the gate electrode material, and the gate dielectric form the TFT gate-channel arrangement according to any one of the preceding examples (e.g., any one of examples 1-13).

Example 20 provides a method of manufacturing a transistor. The method includes providing a seed material over a substrate, providing a channel material shaped as a wire over the seed material, removing a portion of the seed material between at least a portion of the channel material and the substrate (thereby suspending at least a portion of the wire), providing a gate dielectric wrapping around the portion of the channel material (i.e. wrapping around the suspended portion of the wire), and providing a gate electrode material wrapping around the gate dielectric so that the gate dielectric is between the channel material and the gate electrode material.

Example 21 provides the method according to example 20, where removing the portion of the seed material includes forming an opening in the seed material, providing the gate dielectric wrapping around the portion of the channel material includes lining one or more inner surfaces of the opening with the gate dielectric, and providing the gate electrode material includes filling the opening lined with the gate dielectric with the gate electrode material.

Example 22 provides the method according to examples 20 or 21, where providing the gate dielectric includes performing ALD to deposit the gate dielectric.

Example 23 provides the method according to any one of examples 20-22, where providing the gate electrode material includes performing ALD to deposit the gate electrode material.

Example 24 provides the method according to any one of examples 20-23, where the channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, and black phosphorus.

Example 25 provides the method according to any one of examples 20-24, where the seed material includes a dielectric or a conductive material including one or more oxides or nitrides of hafnium, aluminum, zirconium, indium, gallium, zinc, and silicon.

Example 26 provides the method according to any one of examples 20-25, further including providing a first source/drain (S/D) electrode over the channel material, and providing a second S/D electrode over the channel material.

Example 27 provides the method according to any one of examples 20-26, where the transistor is a transistor according to any one of the preceding examples (e.g., any one of examples 14-19).

Example 28 provides the method according to any one of examples 20-27, where the channel material, the gate electrode material, and the gate dielectric form the TFT gate-channel arrangement according to any one of the preceding examples (e.g., any one of examples 1-13)

Example 29 provides an IC package that includes an IC die and a further component, coupled to the IC die. The IC die may include the TFT gate-channel arrangement according to any one of the preceding examples (e.g., any one of examples 1-13) and/or the transistor according to any one of the preceding examples (e.g. any one of examples 14-19). The IC die may include a seed material over a substrate, the seed material including an opening lined with a gate dielectric and filled with a gate electrode material, and a channel material shaped as a wire where the opening is between at least a portion of the wire and the substrate.

Example 30 provides the IC package according to example 29, where the further component is one of a package substrate, a flexible substrate, or an interposer.

Example 31 provides the IC package according to examples 29 or 30, where the further component is coupled to the IC die via one or more first-level interconnects.

Example 32 provides the IC package according to example 31, where the one or more first-level interconnects include one or more solder bumps, solder posts, or bond wires.

Example 33 provides the IC package according to any one of examples 29-32, where the channel material is the channel material according to any one of the preceding examples, and/or the gate dielectric is the gate dielectric according to any one of the preceding examples, and/or the gate electrode material is the gate electrode material according to any one of the preceding examples.

Example 34 provides a computing device that includes a circuit board and an IC die coupled to the circuit board. The IC die includes one or more of the TFT gate-channel arrangement according to any one of the preceding examples (e.g., any one of examples 1-13), the transistor according to any one of the preceding examples (e.g. any one of examples 14-19), and the IC package according to any one of the preceding examples (e.g. any one of examples 29-33).

Example 35 provides the computing device according to example 34, where the computing device is a wearable computing device (e.g., a smart watch) or handheld computing device (e.g., a mobile phone).

Example 36 provides the computing device according to examples 34 or 35, where the computing device is a server processor.

Example 37 provides the computing device according to examples 34 or 35, where the computing device is a motherboard.

Example 38 provides the computing device according to any one of examples 34-37, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
   a support structure;
   a channel material shaped as a wire, wherein the channel material includes a thin film semiconductor material;
   a gate electrode material; and
   a gate dielectric between the channel material and the gate electrode material,
   wherein:
   the gate electrode material includes a bottom portion comprising a portion of the gate electrode material between the channel material and the support structure,
   the bottom portion of the gate electrode material in a layer of a seed material, and
   the seed material includes oxygen and one or more of hafnium, aluminum, zirconium, indium, gallium, zinc, and silicon, or
   the seed material includes nitrogen and one or more of hafnium, aluminum, zirconium, indium, gallium, zinc, and silicon.

2. The IC device according to claim 1, wherein:
   a portion of the gate dielectric is between the bottom portion of the gate electrode material and the channel material, and
   the IC device further includes a further portion of the gate dielectric between the bottom portion of the gate electrode material and the support structure.

3. The IC device according to claim 1, wherein the bottom portion of the gate electrode material is in an opening in the seed material.

4. The IC device according to claim 3, wherein the opening is lined with the gate dielectric.

5. The IC device according to claim 4, wherein a portion of the gate dielectric lining the opening is in contact with the seed material.

6. The IC device according to claim 1, wherein the channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

7. The IC device according to claim 1, wherein the gate dielectric includes one or more of:
   a high-k dielectric material comprising hafnium and oxygen,
   a high-k dielectric material comprising zirconium and oxygen,
   a high-k dielectric material comprising aluminum and oxygen,
   a high-k dielectric material comprising tantalum and oxygen,
   a high-k dielectric material comprising tantalum, silicon, and oxygen,
   a high-k dielectric material comprising hafnium, silicon, and oxygen, and
   a high-k dielectric material comprising lanthanum and oxygen.

8. The IC device according to claim 1, wherein the gate dielectric wraps around the wire.

9. The IC device according to claim 1, wherein a cross-section of the wire taken along a plane perpendicular to a long axis of the wire is between 50 and 500 square nanometers.

10. The IC device according to claim 1, wherein a shape of a cross-section of the wire is a rectangle or a trapezoid.

11. The IC device according to claim 1, wherein the seed material is a dielectric or a conductive material.

12. A transistor arrangement, comprising:
    a channel material shaped as a wire, wherein the channel material includes a textured thin film semiconductor material;
    a gate electrode material;
    a gate dielectric between the channel material and the gate electrode material, wherein the gate dielectric at least partially wraps around the wire;
    a first source/drain (S/D) electrode over the channel material; and
    a second S/D electrode over the channel material,
    wherein at least one of the first S/D electrode and the second S/D electrode includes a semiconductor and an N-type dopant.

13. The transistor arrangement according to claim 12, wherein the first S/D electrode is aligned with a first end of the wire.

14. The transistor arrangement according to claim 12, wherein the second S/D electrode is aligned with a second end of the wire.

15. The transistor arrangement according to claim 12, wherein at least one of the first S/D electrode and the second S/D electrode includes a metal.

16. A method of manufacturing a transistor, the method comprising:
    providing a seed material over a support structure;
    providing a channel material shaped as a wire over the seed material;

removing a portion of the seed material between at least a portion of the channel material and the support structure;

providing a gate dielectric wrapping around the portion of the channel material;

providing a gate electrode material wrapping around the gate dielectric;

providing a first source/drain (S/D) electrode over the channel material; and providing a second S/D electrode over the channel material, wherein the channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus, and wherein the seed material includes a dielectric or a conductive material comprising one or more oxides or nitrides of hafnium, aluminum, zirconium, indium, gallium, zinc, and silicon.

17. The method according to claim 16, wherein:
removing the portion of the seed material includes forming an opening in the seed material,
providing the gate dielectric wrapping around the portion of the channel material includes lining one or more surfaces of the opening with the gate dielectric, and
providing the gate electrode material includes filling the opening lined with the gate dielectric with the gate electrode material.

18. The method according to claim 16, wherein providing the gate dielectric includes performing atomic layer deposition to deposit the gate dielectric.

19. The method according to claim 16, wherein the seed material includes at least one of:

oxygen and one or more of hafnium, aluminum, zirconium, indium, gallium, zinc, and silicon; and nitrogen and one or more of hafnium, aluminum, zirconium, indium, gallium, zinc, and silicon.

20. The method according to claim 19, wherein the seed material is a dielectric or a conductive material.

21. The method according to claim 16, wherein the channel material includes a textured thin film semiconductor material.

22. An integrated circuit (IC) package, comprising:
an IC die, comprising:
a support structure,
a seed material over the support structure, the seed material comprising an opening lined with a gate dielectric and filled with a gate electrode material, and
a channel material shaped as a wire, where the filled opening is between at least a portion of the wire and the support structure; and
a further component, coupled to the IC die,
wherein at least a portion of the channel material includes a material with grains in which at least about 50% of the grains have a preferred crystallographic orientation.

23. The IC package according to claim 22, wherein the further component is one of a package support structure, a flexible support structure, or an interposer.

24. The IC package according to claim 22, wherein:
the seed material includes oxygen and one or more of hafnium, aluminum, zirconium, indium, gallium, zinc, and silicon, or
the seed material includes nitrogen and one or more of hafnium, aluminum, zirconium, indium, gallium, zinc, and silicon.

25. The IC package according to claim 24, wherein the seed material is a dielectric or a conductive material.

* * * * *